United States Patent
Yamamoto

(10) Patent No.: US 7,651,792 B2
(45) Date of Patent: Jan. 26, 2010

(54) HARD FILMS, MULTILAYER HARD FILMS, AND PRODUCTION METHODS THEREOF

(75) Inventor: Kenji Yamamoto, Kobe (JP)

(73) Assignee: Kobe Steel, Ltd., Kobe-shi (JP)

( * ) Notice: Subject to any disclaimer, the term of this patent is extended or adjusted under 35 U.S.C. 154(b) by 0 days.

(21) Appl. No.: 12/196,826

(22) Filed: Aug. 22, 2008

(65) Prior Publication Data

US 2008/0318013 A1 Dec. 25, 2008

Related U.S. Application Data

(62) Division of application No. 11/348,373, filed on Feb. 7, 2006, now Pat. No. 7,442,247.

(30) Foreign Application Priority Data

| Feb. 16, 2005 | (JP) | ............................... 2005-039738 |
| Mar. 11, 2005 | (JP) | ............................... 2005-069379 |

(51) Int. Cl.
*B32B 9/00* (2006.01)

(52) U.S. Cl. ............... 428/697; 204/192.1; 204/192.12; 204/192.15; 204/192.16; 204/298.13; 427/419.1; 427/419.7; 427/523; 427/530; 427/532; 428/698; 428/699; 428/704

(58) Field of Classification Search ............... 204/192.1, 204/192.12, 192.15, 192.16, 298.13; 428/697, 428/698, 699, 704; 427/419.1, 419.7, 523, 427/530

See application file for complete search history.

(56) References Cited

U.S. PATENT DOCUMENTS

| 4,714,660 A | 12/1987 | Gates, Jr. |
| 6,110,571 A | 8/2000 | Yaginuma et al. |
| 6,767,658 B2 | 7/2004 | Yamamoto et al. |
| 6,824,601 B2 | 11/2004 | Yamamoto et al. |
| 6,887,562 B2 | 5/2005 | Hugosson |
| 7,056,602 B2 | 6/2006 | Horling et al. |
| 7,083,868 B2 | 8/2006 | Horling et al. |
| 7,258,912 B2 | 8/2007 | Yamamoto et al. |
| 2003/0148145 A1 | 8/2003 | Yamamoto et al. |

FOREIGN PATENT DOCUMENTS

| DE | 102 33 222 A1 | 2/2003 |
| EP | 1 378 304 A2 | 1/2004 |
| JP | 2644710 | 5/1997 |
| JP | 2003/34858 | 2/2003 |
| JP | 2003-71610 | 3/2003 |
| JP | 2004-11018 | 1/2004 |
| JP | 2005/226117 | 8/2005 |

*Primary Examiner*—Archene Turner
(74) *Attorney, Agent, or Firm*—Oblon, Spivak, McClelland, Maier & Neustadt, L.L.P.

(57) ABSTRACT

A hard film contains $[(Nb_{1-d},Ta_d)_a Al_{1-a}](C_{1-x}N_x)$, $[(Nb_{1-d},Ta_d)_a Al_{1-a-b-c} Si_b B_c](C_{1-x}N_x)$, $[(Cr,V)_p(Nb,Ta)_q(Al,Si,B)_r](C_{1-x}N_x)$, or $[(Ti,Cr,V)_p(Nb,Ta)_q(Al,Si,B)_r](C_{1-x}N_x)$, in which the atomic ratios satisfy the following conditions: $0.4 \leq a \leq 0.6$, $0 < b+c \leq 0.15$, $0 \leq d \leq 1$, $0.4 \leq x \leq 1$, provided that one of "b" and "c" may be zero but both of them are not simultaneously zero, $p+q+r=1$; $p_{Ti}+p_{Cr}+p_V=p$; $q_{Nb}+q_{Ta}=q$; $r_{Al}+r_{Si}+r_B=r$, $0.05 \leq q$, $0.5 \leq r \leq 0.73$, $0 \leq r_{Si}+r_B \leq 0.15$, and $0.4 \leq x \leq 1.0$, provided that when $p_{Ti}$ is greater than zero, the total of $p_{Cr}$, $p_V$, $r_{Si}$, and $r_B$ is greater than zero.

8 Claims, 1 Drawing Sheet

HARD FILMS, MULTILAYER HARD FILMS, AND PRODUCTION METHODS THEREOF

BACKGROUND OF THE INVENTION

1. Field of the Invention

The present invention relates to hard films. More specifically, it relates to hard films to be arranged on cutting tools such as tips, drills, and end mills, and tools such as forging dies and stamping punches.

2. Description of the Related Art

For improving wear resistance of cutting tools, hard films such as TiN, TiCN, or TiAlN are applied to base materials such as high-speed tool steel, cemented carbide, or cermet. In particular, multicomponent (carbo) nitride films of titanium and aluminum such as TiAlN films and TiAlCN films (hereinafter referred to as "TiAl hard films"), as disclosed in Japanese Patent No. 2644710, exhibit excellent wear resistance, and they are suitably applied to cutting tools for high-speed cutting operation or for cutting materials with high hardness such as hardened steels. However, further demands have been made to provide hard films with more excellent wear resistance with increasing hardness of materials to be cut or increasing speed of cutting operation. In addition, high-speed tool steels such as Japanese Industrial Standards (JIS) SKD11 steel are often cut by using cutting tools at high speed instead of electrodischarge machining. Therefore, hard films excellent not only in wear resistance but also in oxidation resistance are required.

Another possible solution is a technique of adding Cr or V to TiAl hard films to thereby maintain a high-hardness cubic crystal structure while increasing the Al content to thereby yield films with improved oxidation resistance (Japanese Laid-open (Unexamined) Patent Publications (JP-A) No. 2003-71610 and No. 2003-34858). CrAlVN films containing no Ti have also been proposed.

SUMMARY OF THE INVENTION

Under these circumstances, an object of the present invention is to provide hard films that are more excellent in at least one (preferably both) of oxidation resistance and wear resistance than conventional hard films including TiAl hard films such as TiAlN films, and Cr- and/or V-added hard films such as TiCrAlN films and TiVAlN films (hereinafter referred to as "TiCrVAl hard films").

After intensive investigations to achieve these objects, the present inventors found that at least one (preferably both) of oxidation resistance and wear resistance (hardness) can be improved as compared with conventional hard films such as TiAlN films, TiCrAlN films, and TiVAl films by using Nb and/or Ta. The present invention has been achieved based on these findings.

1) NbTaAl Hard Films According to the First Embodiment

Hard films according to the present invention are aluminum (carbo) nitride hard films further combined with Nb and/or Ta (hereinafter referred to as "NbTaAl hard films" or "NbTaAl hard films according to the first embodiment") The NbTaAl hard films are represented by $[(Nb_{1-d}, Ta_d)_a Al_{1-a}](C_{1-x}N_x)$, wherein "a", "d", and "x" each independently represent an atomic ratio and satisfy the following conditions: $0.4 \leq a \leq 0.6$, $0 \leq d \leq 1$, and $0.4 \leq x \leq 1$. The NbTaAl hard films may further contain Si and/or B. Specifically, the hard films according to the present invention can be represented by $[(Nb_{1-d}, Ta_d)_a Al_{1-a-b-c} Si_b B_c](C_{1-x}N_x)$, wherein "a", "b", "c", "d", and "x" each independently represent an atomic ratio and satisfy the following conditions: $0.4 \leq a \leq 0.6$, $0 < b+c \leq 0.15$, $0 \leq d \leq 1$, and $0.4 \leq x \leq 1$, provided that one of "b" and "c" may be zero but both of them are not simultaneously zero (hereinafter referred to as "SiB-added NbTaAl hard film").

The NbTaAl hard films (including SiB-added NbTaAl hard films) according to the present invention can be hard films deposited by cathode-discharge arc ion plating in a nitrogen-containing gas or a gaseous mixture containing carbon and nitrogen using a target containing $[(Nb_{1-d}, Ta_d)_a Al_{1-a}]$, wherein "a" and "d" each independently represent an atomic ratio and satisfy the following conditions: $0.4 \leq a \leq 0.6$, $0 \leq d \leq 1$, or a target containing $[(Nb_{1-d}, Ta_d)_a Al_{1-a-b-c} Si_b B_c]$, wherein "a", "b", "c", and "d" each independently represent an atomic ratio and satisfy the following conditions: $0.4 \leq a \leq 0.6$, $0 < b+c \leq 0.15$, $0 \leq d \leq 1$, provided that one of "b" and "c" may be zero but both of them are not simultaneously zero.

2) TiCrV-Based NbTaAl Hard Films (NbTaAl Hard Films According to the Second Embodiment)

Hard films according to the present invention can also be TiCrVAl hard films combined with Nb and/or Ta. These hard films do not necessarily contain Ti. Cr and V are not essential when they contain Ti (these films are hereinafter referred to as "TiCrV-based NbTaAl hard films", or "NbTaAl hard films according to the second embodiment"). The NbTaAl hard films according to the second embodiment may further contain Si and/or B according to necessity.

If not containing Ti, the NbTaAl hard films according to the second embodiment can be represented by $[(Cr,V)_p(Nb,Ta)_q(Al,Si,B)_r](C_{1-x}N_x)$, which composition satisfies following Conditions (1) to (8):

| | |
|---|---|
| $p+q+r=1$ | Condition(1) |
| $p_{Cr}+p_V=p$ | Condition(2) |
| $q_{Nb}+q_{Ta}=q$ | Condition(3) |
| $r_{Al}+r_{Si}+r_B=r$ | Condition(4) |
| $0.5 \leq q$ | Condition(5) |
| $0.5 \leq r \leq 0.73$ | Condition(6) |
| $0 \leq r_{Si}+r_B \leq 0.15$ | Condition(7) |
| $0.4 \leq x \leq 1.0$ | Condition(8) | wherein $p_{Cr}$ represents the atomic ratio of Cr; $p_V$ represents the atomic ratio of V; $q_{Nb}$ represents the atomic ratio of Nb; $q_{Ta}$ represents the atomic ratio of Ta; $r_{Al}$ represents the atomic ratio of Al; $r_{Si}$ represents the atomic ratio of Si; $r_B$ represents the atomic ratio of B; and x represents the atomic ratio of N.

If containing Ti, the NbTaAl hard films according to the second embodiment can be represented by $[(Ti,Cr,V)_p(Nb,Ta)_q(Al,Si,B)_r](C_{1-x}N_x)$, which composition satisfies following Conditions (1A) to (10A):

| | |
|---|---|
| $p+q+r=1$ | Condition(1A) |
| $p_{Ti}+p_{Cr}+p_V=p$ | Condition(2A) |
| $q_{Nb}+q_{Ta}=q$ | Condition(3A) |
| $r_{Al}+r_{Si}+r_B=r$ | Condition(4A) |
| $0.5 \leq q$ | Condition(5A) |
| $0.5 \leq r \leq 0.73$ | Condition(6A) |
| $0 \leq r_{Si}+r_B \leq 0.15$ | Condition(7A) |

$$p_{Ti}>0 \qquad \text{Condition(8A)}$$

$$p_{Cr}+p_V+r_{Si}+r_B>0 \qquad \text{Condition(9A)}$$

$$0.4 \leq x \leq 1.0 \qquad \text{Condition(10A)}$$

wherein $p_{Ti}$ represents the atomic ratio of Ti; $p_{Cr}$ represents the atomic ratio of Cr; $p_V$ represents the atomic ratio of V; $q_{Nb}$ represents the atomic ratio of Nb; $q_{Ta}$ represents the atomic ratio of Ta; $r_{Al}$ represents the atomic ratio of Al; $r_{Si}$ represents the atomic ratio of Si; $r_B$ represents the atomic ratio of B; and x represents the atomic ratio of N.

The NbTaAl hard films according to the second embodiment can be hard films deposited by cathode-discharge arc ion plating in a nitrogen-containing gas or a gaseous mixture containing carbon and nitrogen using a target containing [(Cr,V)$_p$(Nb,Ta)$_q$(Al,Si,B)$_r$] and satisfying following Conditions (1) to (7), or a target containing [(Ti,Cr,V)$_p$(Nb,Ta)$_q$(Al,Si,B)$_r$] and satisfying following Conditions (1A) to (9A):

$$p+q+r=1 \qquad \text{Condition(1)}$$

$$p_{Cr}+p_V=p \qquad \text{Condition(2)}$$

$$q_{Nb}+q_{Ta}=q \qquad \text{Condition(3)}$$

$$r_{Al}+r_{Si}+r_B=r \qquad \text{Condition(4)}$$

$$0.5 \leq q \qquad \text{Condition(5)}$$

$$0.5 \leq r \leq 0.73 \qquad \text{Condition(6)}$$

$$0 \leq r_{Si}+r_B \leq 0.15 \qquad \text{Condition(7)}$$

$$p+q+r=1 \qquad \text{Condition(1A)}$$

$$p_{Ti}+p_{Cr}+p_V=p \qquad \text{Condition(2A)}$$

$$q_{Nb}+q_{Ta}=q \qquad \text{Condition(3A)}$$

$$r_{Al}+r_{Si}+r_B=r \qquad \text{Condition(4A)}$$

$$0.5 \leq q \qquad \text{Condition(5A)}$$

$$0.5 \leq r \leq 0.73 \qquad \text{Condition(6A)}$$

$$0 \leq r_{Si}+r_B \leq 0.15 \qquad \text{Condition(7A)}$$

$$p_{Ti}>0 \qquad \text{Condition(8A)}$$

$$p_{Cr}+p_V+r_{Si}+r_B>0 \qquad \text{Condition(9A)}$$

wherein $p_{Ti}$ represents the atomic ratio of Ti; $p_{Cr}$ represents the atomic ratio of Cr; $p_V$ represents the atomic ratio of V; $q_{Nb}$ represents the atomic ratio of Nb; $q_{Ta}$ represents the atomic ratio of Ta; $r_{Al}$ represents the atomic ratio of Al; $r_{Si}$ represents the atomic ratio of Si; and $r_B$ represents the atomic ratio of B.

3) Multilayer Hard Films

Hard films according to the present invention can be multilayer hard films including a layer of the NbTaAl hard film according to the first or second embodiment and another layer arranged alternately. Hereinafter, multilayer hard films including a layer of the NbTaAl hard film according to the first embodiment are referred to as "multilayer hard films according to the first embodiment", and multilayer hard films including a layer of the NbTaAl hard film according to the second embodiment are referred to as "multilayer hard films according to the second embodiment".

3-1) Multilayer Hard Films According to the First Embodiment

More specifically, the multilayer hard films according to the first embodiment can be multilayer hard films each including at least one assemblage of a Layer A or a Layer B with a Layer C arranged alternately. Layer A is a layer of the NbTaAl hard film according to the first embodiment in which SiB are not added; Layer B is a layer of the NbTaAl hard film according to the first embodiment in which Si and/or B is added; and Layer C is a layer containing [(Nb$_{1-D}$,Ta$_D$)$_A$, Al$_{1-A-B-C}$, Si$_B$, B$_C$](C$_{1-x}$N$_x$), wherein "A", "B", "C", "D", and "x" each independently represent an atomic ratio and satisfy the following conditions: $0.2 \leq A \leq 0.5$, $0.15 < B+C \leq 0.5$, $0 \leq D \leq 1$, and $0.4 \leq x \leq 1$, provided that one of B and C may be zero but both of them are not simultaneously zero.

The multilayer hard films according to the first embodiment can be multilayer hard films prepared by alternately repeating the steps of:

depositing a film by cathode-discharge arc ion plating in a nitrogen-containing gas or a gaseous mixture containing carbon and nitrogen using a target containing [(Nb$_{1-d}$, Ta$_d$)$_a$ Al$_{1-a}$], wherein "a" and "d" each independently represent anatomic ratio and satisfy the following conditions: $0.4 \leq a \leq 0.6$ and $0 \leq d \leq 1$, or a target containing [(Nb$_{1-d}$,Ta$_d$)$_a$, Al$_{1-a-b-c}$, Si$_b$,B$_c$], wherein "a", "b", "c", and "d" each independently represent an atomic ratio and satisfy the following conditions: $0.4 \leq a \leq 0.6$, $0 < b+c \leq 0.15$, and $0 \leq d \leq 1$, provided that one of "b" and "c" may be zero but both of them are not simultaneously zero; and depositing a film by sputtering in a nitrogen-containing gas or a gaseous mixture containing carbon and nitrogen using a target containing [(Nb$_{1-D}$,Ta$_D$)$_A$, Al$_{1-A-B-C}$,Si$_B$,B$_C$], wherein A, B, C, and D each independently represent an atomic ratio and satisfy the following conditions: $0.2 \leq A \leq 0.5$, $0.15 < B+C \leq 0.5$, and $0 \leq D \leq 1$, provided that one of B and C may be zero but both of them are not simultaneously zero.

In the multilayer hard films according to the first embodiment, the Layer A or Layer B can have a thickness of, for example, 5 nm or more, and the Layer C can have a thickness of, for example, 1 nm or more.

3-2) Multilayer Hard Films According to the Second Embodiment

The multilayer hard films according to the second embodiment are multilayer films including at least one assemblage of a Layer S and a Layer T arranged alternately. The Layer S contains [(Ti,Cr,V)$_p$(Nb,Ta)$_q$(Al,Si,B)$_r$](C$_{1-x}$N$_x$) and satisfies following Conditions (1B) to (8B), and the Layer T contains [(Ti,Cr,V)$_p$(Nb,Ta)$_q$(Al,Si,B)$_r$](C$_{1-x}$N$_x$) and satisfies following Conditions (1C) to (8C):

$$p+q+r=1 \qquad \text{Condition(1B)}$$

$$p_{Ti}+p_{Cr}+p_V=p \qquad \text{Condition(2B)}$$

$$q_{Nb}+q_{Ta}=q \qquad \text{Condition(3B)}$$

$$r_{Al}+r_{Si}+r_B=r \qquad \text{Condition(4B)}$$

$$0.5 \leq q \qquad \text{Condition(5B)}$$

$$0.5 \leq r \leq 0.73 \qquad \text{Condition(6B)}$$

$$0 \leq r_{Si}+r_B \leq 0.15 \qquad \text{Condition(7B)}$$

$$0.4 \leq x \leq 1.0 \qquad \text{Condition(8B)}$$

$$p+q+r=1 \qquad \text{Condition(1C)}$$

$$p_{Ti}+p_{Cr}+p_V=p \qquad \text{Condition(2C)}$$

$q_{Nb}+q_{Ta}=q$  Condition(3C)

$r_{Al}+r_{Si}+r_B=r$  Condition(4C)

$0.5 \leq q$  Condition(5C)

$0.5 \leq r \leq 0.8$  Condition(6C)

$0.15 \leq r_{Si}+r_B \leq 0.5$  Condition(7C)

$0.4 \leq x \leq 1.0$  Condition(8C)

wherein $p_{Ti}$ represents the atomic ratio of Ti; $p_{Cr}$ represents the atomic ratio of Cr; $p_V$ represents the atomic ratio of V; $q_{Nb}$ represents the atomic ratio of Nb; $q_{Ta}$ represents the atomic ratio of Ta; $r_{Al}$ represents the atomic ratio of Al; $r_{Si}$ represents the atomic ratio of Si; $r_B$ represents the atomic ratio of B; and x represents the atomic ratio of N.

The multilayer hard films according to the second embodiment can be multilayer hard films prepared by alternately repeating the steps of:

depositing the Layer S by cathode-discharge arc ion plating in a nitrogen-containing gas or a gaseous mixture containing carbon and nitrogen using a target S containing [(Ti,Cr,V)$_p$(Nb,Ta)$_q$(Al,Si,B)$_r$] and satisfying following Conditions (1B) to (7B); and depositing the Layer T by sputtering in a nitrogen-containing gas or a gaseous mixture containing carbon and nitrogen using a target T containing [(Ti,Cr,V)$_p$(Nb,Ta)$_q$(Al,Si,B)$_r$] and satisfying following Conditions (1C) to (7C):

$p+q+r=1$  Condition(1B)

$p_{Ti}+p_{Cr}+p_V=p$  Condition(2B)

$q_{Nb}+q_{Ta}=q$  Condition(3B)

$r_{Al}+r_{Si}+r_B=r$  Condition(4B)

$0.5 \leq q$  Condition(5B)

$0.5 \leq r \leq 0.73$  Condition(6B)

$0 \leq r_{Si}+r_B \leq 0.15$  Condition(7B)

$p+q+r=1$  Condition(1C)

$p_{Ti}+p_{Cr}+p_V=p$  Condition(2C)

$q_{Nb}+q_{Ta}=q$  Condition(3C)

$r_{Al}+r_{Si}+r_B=r$  Condition(4C)

$0.05 \leq q$  Condition(5C)

$0.5 \leq r \leq 0.8$  Condition(6C)

$0.15 \leq r_{Si}+r_B \leq 0.5$  Condition(7C)

wherein $p_{Ti}$ represents the atomic ratio of Ti; $p_{Cr}$ represents the atomic ratio of Cr; $p_V$ represents the atomic ratio of V; $q_{Nb}$ represents the atomic ratio of Nb; $q_{Ta}$ represents the atomic ratio of Ta; $r_{Al}$ represents the atomic ratio of Al; $r_{Si}$ represents the atomic ratio of Si; and $r_B$ represents the atomic ratio of B.

In the multilayer hard films according to the second embodiment, the Layer S can have a thickness of, for example, 5 nm or more, and the Layer T can have a thickness of, for example, 1 nm or more.

3-3) Production methods

The multilayer hard films according to the first embodiment can be produced by using a deposition system containing at least one arc evaporation source and at least one sputtering evaporation source; allowing the arc evaporation source and the sputtering evaporation source to discharge simultaneously; and alternately repeating the steps of:

placing a work in the front of the arc evaporation source to deposit the Layer A or the Layer B by cathode-discharge arc ion plating; and placing the work in the front of the sputtering evaporation source to deposit the Layer C by sputtering.

The multilayer hard films according to the second embodiment can be produced by using a deposition system containing at least one arc evaporation source and at least one sputtering evaporation source; allowing the arc evaporation source and the sputtering evaporation source to discharge simultaneously; and alternately repeating the steps of:

placing a work in the front of the arc evaporation source to deposit the Layer S by cathode-discharge arc ion plating; and placing the work in the front of the sputtering evaporation source to deposit the Layer T by sputtering.

Further objects, features and advantages of the present invention will become apparent from the following description of the preferred embodiments with reference to the attached drawings.

DESCRIPTION OF THE PREFERRED EMBODIMENTS

Figure 1:
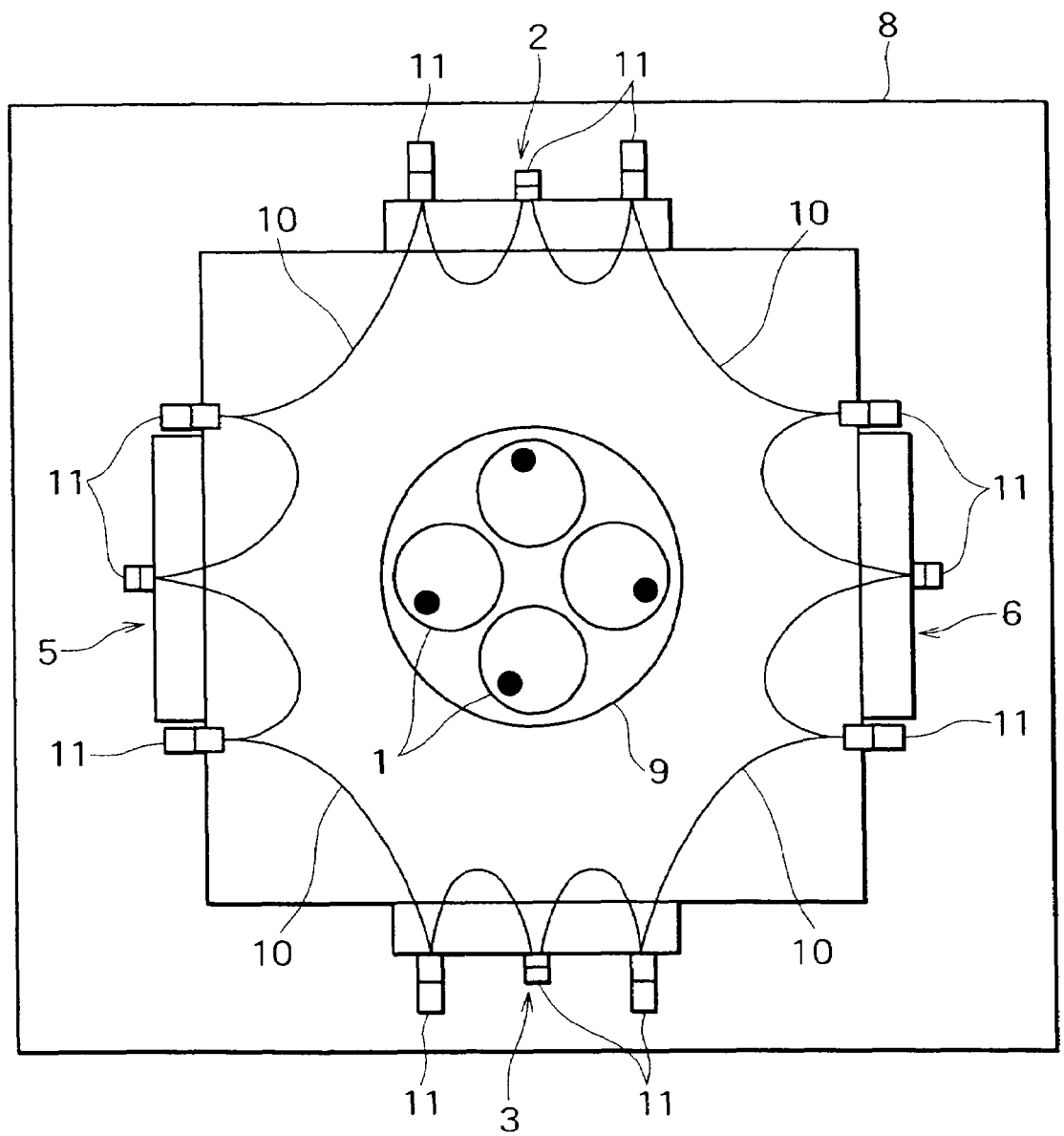
FIG. 1 is a schematic view of a system for producing hard films according to the present invention.

1) NbTaAl Hard Films According to the First Embodiment

For providing hard films that are more excellent in hardness and oxidation resistance than conventional TiAl hard films such as TiAlN films and TiAlCN films, the present inventors prepared a variety of hard films and determined their crystal structures, hardness, oxidation resistance, and durability on cutting tools. Consequently, they found that nitrides or carbonitrides combined with Nb and/or Ta instead of Ti [NbAlCN, TaAlCN, NbTaAlCN; and corresponding compounds wherein the (CN) moiety is (N) (NbTaAl hard films according to the first embodiment)] are very excellent in hardness and oxidation resistance (oxidation starting temperature).

The NbTaAl hard films according to the first embodiment have more excellent oxidation resistance than TiAl hard films probably for the following reasons. Specifically, the TiAl hard films are highly resistant to oxidation because Al is preferentially oxidized at high temperatures under an oxidation atmosphere to form a protective aluminum oxide film as the outermost surface. At certain temperatures or higher, however, the TiAl hard films preferentially yield a Ti oxide film having lower protective performance than the aluminum oxide film, resulting insignificant decrease in oxidation resistance. In contrast, Ta oxide and Nb oxide remain amorphous without grain boundaries up to relatively high temperatures (about 1000° C.) and thereby have more excellent protective performance than Ti oxide. Probably for this reason, the NbTaAl hard films according to the first embodiment have more excellent oxidation resistance than the TiAl hard films.

The NbTaAl hard films according to the first embodiment have higher hardness than TiAl hard films probably because the following reasons. The TiAl hard films have high hardness because metastable cubic crystal AlN having a lattice constant of 4.12 angstroms is dissolved to form a solid solution in the lattices of TiN having a lattice constant of 4.24 angstroms.

In contrast, in the NbTaAl hard films according to the first embodiment, TaN and NbN have lattice constants of 4.339 angstroms and 4.389 angstroms, respectively, which are much higher than that of cubic crystal AlN, as compared with the TiAl hard films. Consequently, the NbTaAl hard films according to the first embodiment can have greater lattice strain than the TiAl hard films have. This is probably the reason why the NbTaAl hard films according to the first embodiment are also excellent in hardness.

The NbTaAl hard films according to the first embodiment can be represented by $[(Nb_{1-d},Ta_d)_aAl_{1-a}](C_{1-x}N_x)$, wherein "a", "d" and "x" each independently represent an atomic ratio.

In the above formula, "a" is 0.4 or more and 0.6 or less. An excessively low atomic ratio "a" results in an excessively high proportion of Al, and the film becomes to have a relatively soft hexagonal crystal structure (also referred to as "wurtzite structure") and thereby has decreased hardness. The atomic ratio "a" should be 0.4 or more and is preferably 0.45 or more, and more preferably 0.5 or more. The hardness increases with an increasing atomic ratio "a". An excessively high atomic ratio "a", however, reduces the accumulated strain by the combination use of Al with Nb and/or Ta to thereby reduce the hardness. The atomic ratio "a" should be 0.6 or less and is preferably 0.55 or less.

The atomic ratio "d" can be 1, namely, the films can be TaAl hard films. It can also be zero, namely, the films can be NbAl hard films. Additionally, the films can be hard films containing both Ta and Nb.

The atomic ratio "x" can be 1, namely, the hard films can be nitride films. However, the hardness of the films can be increased with a decreasing "x", i.e., with an increasing atomic ratio of carbon. However, an excessively low atomic ratio "x" may often invite unstable AlC compounds. Accordingly, the atomic ratio "x" should be 0.4 or more and is preferably 0.6 or more, more preferably 0.7 or more, and particularly preferably 0.8 or more.

The NbTaAl hard films according to the first embodiment may further comprise Si and/or B, and the resulting hard films (SiB-added NbTaAl hard films) can be represented by $[(Nb_{1-d},Ta_d)_aAl_{1-a-b-c},Si_b,B_c](C_{1-x}N_x)$. The compositional formula $[(Nb_{1-d},Ta_d)_aAl_{1-a-b-c},Si_b,B_c](C_{1-x}N_x)$ has a broadest meaning including not only the case when B forms carbonitrides but also the case when B forms borides with other elements such as Nb and/or Ta, Al, and Si. In the formula, "a", "b", "c", "d", and "x" each independently represent an atomic ratio, and their ranges are as above. By adding Si and/or B, Si—N bonds and/or B—N bonds are formed at grain boundaries to inhibit the growth of crystal grains. Thus, the NbTaAl hard films can have finer crystal grains and higher hardness. Additionally, the films can have increased oxidation resistance, while the reason of this has not yet been clarified.

The total amount of Si and/or B (the atomic ratio "b+c" in the formula) is more than zero, preferably 0.01 or more, more preferably 0.03 or more, and particularly preferably 0.5 or more. The hardness and oxidation resistance increase with an increasing atomic ratio "b+c". However, at an excessively high atomic ratio "b+c", the film cannot significantly have a cubic crystal structure, may transfer to a hexagonal crystal or become amorphous, resulting in reduced hardness. The atomic ratio "b+c" is preferably 0.15 or less.

Either one or both of Si and B can be added. Accordingly, one of the atomic ratios "b" and "c" can be zero. When importance is placed on the oxidation resistance, however, it is recommended to add both of Si and B or add Si alone, since Si acts to increase oxidation resistance more highly than B does. In contrast, when importance is placed on lubricating properties, it is recommended to add both of Si and B or add B alone, since B forms B—N bonds having lubrication action.

2) TiCrV-Based NbTaAl Hard Films (NbTaAl Hard Films According to the Second Embodiment)

The hard films according to the present invention can be TiCrVAl hard films, such as TiCrAlN, TiVAlN, CrAlN, and CrAlVN films, further combined with Nb and/or Ta. These hard films are referred to as "TiCrV-based NbTaAl hard films" ("NbTaAl hard films according to the second embodiment"). The present inventors further made intensive investigations to provide hard films having more excellent oxidation resistance and hardness than TiCrVAl hard films and found that, by replacing part of Ti, Cr, and/or V of the TiCrVAl hard films with Nb and/or Ta, the resulting hard films can have higher hardness and more excellent oxidation resistance. They also found that, by replacing part of Al with Si and/or B according to necessity, the hard films can have further higher hardness and further more excellent oxidation resistance. The NbTaAl hard films according to the second embodiment may not contain Ti (Ti-free NbTaAl hard films according to the second embodiment) or may contain Ti (Ti-containing NbTaAl hard films according to the second embodiment). Cr and V are not essential when the hard films contain Ti.

The NbTaAl hard films according to the second embodiment will be more specifically illustrated below. The Ti-free NbTaAl hard films according to the second embodiment can be represented by $[(Cr,V)_p(Nb,Ta)_q(Al,Si,B)_r](C_{1-x}N_x)$ and satisfy Conditions (1) to (8). The Ti-containing NbTaAl hard films according to the second embodiment can be represented by $[(Ti,Cr,V)_p(Nb,Ta)_q(Al,Si,B)_r](C_{1-x}N_x)$ and satisfy Conditions (1A) to (10A). These NbTaAl hard films according to the second embodiment include not only the case where B forms carbonitrides but also the case where B forms borides typically with Ti, Cr, V, Nb, Ta, Al, and/or Si. These NbTaAl hard films according to the second embodiment have more excellent oxidation resistance and higher hardness than conventional hard films such as TiAl hard films and TiCrVAl hard films and are very advantageously used as hard films typically for tools and dies to thereby improve the durability of the tools and dies.

The NbTaAl hard films according to the second embodiment will be described in further detail below.

Nb and/or Ta is added for the following reasons. In the conventional TiAl hard films, Ti oxides having lower protective performance are preferentially formed, and their oxidation resistance must be improved as described above. The oxidation resistance is improved by adding Cr but is still insufficient. In contrast, Ta oxides and Nb oxides remain amorphous and do not have grain boundaries up to relatively high temperatures (about 1000° C.) and are more excellent in protective performance. For further improving oxidation resistance, therefore, Ta and/or Nb is preferably added instead of Ti. Nb and Ta also serve to improve oxidation resistance of V-containing films. Vanadium (V) is an element that impairs oxidation resistance. Vanadium impairs oxidation resistance because the resulting V oxides have low melting points and thereby have reduced protective performance as oxide films. Accordingly, the oxidation resistance of the V-containing hard films can also be improved by adding Nb and/or Ta, as in the Ti-containing hard films.

The addition of Nb and/or Ta can also increase the hardness of films, as in the NbTaAl hard films according to the first embodiment. The reasons for this are as follows. Nitride films such as TiAlN, TiCrAlN, TiVAlN, CrAlN, and CrAlVN films comprise multicomponent nitrides of TiN, VN, CrN, and/or AlN each having a lattice constant of 4.1 to 4.2 angstroms, and these multicomponent nitride films have lattice constants of 4.1 to 4.2 angstroms. In contrast, nitrides of Ta and Nb have a lattice constant of about 4.339 angstroms (in the case of TaN) to about 4.3898 angstroms (in the case of NbN), higher than those of the multicomponent nitrides. Accordingly, the addition of Nb and/or Ta results in greater lattice strain and higher hardness.

The total atomic ratio "q" of Ta, Nb, i.e., $q_{Nb}+q_{Ta}$, should be 0.05 or more for securing sufficient lattice strain to thereby increase hardness and improve oxidation resistance. Specifically, the hard films must satisfy Condition (5) or Condition (5A). However, if Nb and/or Ta is added in an amount much higher than the total amount of Ti, Cr, and V, hardening due to lattice strain decreases. Accordingly, the atomic ratio "q" is preferably 1.2 folds or less the total atomic ratio "p" of Ti, Cr and V, wherein p equals $p_{Ti}+p_{Cr}+p_V$ in the case where Ti is contained, and p equals $p_{Cr}+p_V$ in the case where Ti is not contained. The total atomic ratio q is preferably 0.07 or more, and more preferably 0.08 or more, and preferably 0.4 or less, and more preferably 0.3 or less. Either one or both of Ta and Nb can be added.

The total content p (atomic ratio) of Cr and V in the case of Ti-free NbTaAl hard films according to the second embodiment or the total content p of Ti, Cr, and V in the case of Ti-containing NbTaAl hard films according to the second embodiment is not limited, as long as it is more than zero. The total content p is, for example, 0.03 or more, preferably 0.05 or more, and more preferably 0.15 or more in terms of atomic ratio. The upper limit of the total content p is, for example, about 0.6, preferably about 0.4, and more preferably about 0.3. Since nitrides of Ti, Cr and V have lattice constants near to that of cubic crystal AlN, the addition of these elements allows the hard films to have a high content of Al that improves the oxidation resistance while maintaining a highly hard cubic crystal structure. Among them, nitrides of Cr and V have lattice constants substantially equal to that of AlN, and the addition of these elements makes advantages significantly. Either one or both of Cr and V can be added to the Ti-free NbTaAl hard films according to the second embodiment. The addition of Cr and/or V is optional in the Ti-containing NbTaAl hard films according to the second embodiment, and if added, either one or both of Cr and V can be added.

The total atomic ratio r ($r_{Al}+r_{Si}+r_B$) of Al, Si, and B must be 0.5 or more. If the total content r in terms of atomic ratio is less than 0.5, both the oxidation resistance and hardness are insufficient. If it exceeds 0.73, the film predominantly comprises hexagonal crystals having low hardness. Accordingly the total content r must be 0.73 or less. Therefore, the total content r should satisfy Condition (6) or Condition (6A) and is preferably 0.55 to 0.65.

Si and B may not necessarily added, but part of Al is preferably replaced with Si and/or B for further improving oxidation resistance. Si and B also act to yield finer crystal grains of the film to thereby yield higher hardness. However, if the total content of Si and B in terms of atomic ratio ($r_{Si}+r_B$) exceeds 0.15, the film becomes amorphous and shows decreased hardness. The total content $r_{Si}+r_B$ should therefore be 0.15 or less, namely, it must satisfy Condition (7) or Condition (7A). If the total content $r_{Si}+r_B$ is preferably 0.01 or more, since if it is less than 0.01, the advantages of the addition of Si and/or B may be insufficient. Namely, the total content of Si and B in terms of atomic ratio is preferably 0.01 to 0.15, and more preferably 0.03 to 0.1. Either one or both of Si and B can be added.

For improving insufficient hardness of Ti-containing NbTaAl hard films according to the second embodiment, they must contain Cr or V having higher hardness, or contain Si and/or B for forming compounds having higher hardness, such as TiSiN or TiBN. Specifically, these hard films must satisfy Condition (9A).

The specified range, preferred range, and reasons therefor of the atomic ratio "x" are the same as in the NbTaAl hard films according to the first embodiment. Namely, the atomic ratio "x" must satisfy Condition (8) or Condition (10A). The hard films according to the present invention form highly hard VC compounds and thereby show higher hardness as a whole when carbon (C) is added. Accordingly, carbon can be added in a content substantially the same as V, or carbon may be added in such a content as to satisfy the condition: $(p_V-0.2) \leq (1-x) \leq (p_V+0.2)$.

The hard films according to the present invention (NbTaAl hard films according to the first and second embodiments) can have a crystal structure including cubic crystals and hexagonal crystals as a mixture, as long as they have satisfactory hardness and oxidation resistance, but preferably have a sodium chloride crystal structure mainly comprising cubic crystals. The hardness of the hard films increases with an increasing ratio of cubic crystals.

3) Multilayer Hard Films

The hard films according to the present invention can be multilayer hard films according to the first embodiment or multilayer hard films according to the second embodiment. The multilayer hard films according to the first embodiment each comprise at least one assemblage of a layer of the NbTaAl hard film according to the first embodiment (including SiB-added films) and another layer. The multilayer hard films according to the second embodiment comprise at least one assemblage of a layer of the NbTaAl hard film according to the second embodiment (either of Ti-free and Ti-containing hard films will do) and another layer. The term "multilayer structure" as used herein means a multilayer structure of plural layers having different compositions. A multilayer assemblage of layers having the same composition is defined herein as a NbTaAl hard film having a single-layer structure.

3-1) Multilayer Hard Films According to the First Embodiment

The NbTaAl hard films according to the first embodiment having a single-layer structure can have higher oxidation resistance by arranging a hard film having higher oxidation resistance on one or both sides thereof. Some of such additional hard films, however, may show insufficient adhesion at the interfaces between layers and may invite delamination. The present inventors found that hard films having more excellent oxidation resistance (multilayer hard films according to the first embodiment) can be obtained by alternately laminating a layer satisfying the compositional requirements in the NbTaAl hard films according to the first embodiment (also referred to as "Layer A") or a layer satisfying the compositional requirements in the SiB-added NbTaAl hard films (also referred to as "Layer B") with a layer of a hard film having a lower atomic ratio of Nb and/or Ta or higher atomic ratio of Si and/or B than the SiB-added NbTaAl hard films (also referred to as "Layer C"). The layer C of the multilayer hard films according to the first embodiment has a composition similar to those of Layer A and Layer B and thereby does not invite problems such as peeling.

Layer C can be represented by $[(Nb_{1-D},Ta_D)_A,Al_{1-A-B-C},Si_B,B_C](C_{1-x}N_x)$, wherein "A", "B", "C", "D", and "x" each independently represent an atomic ratio. Layer C must have sufficient oxidation resistance and must not excessively reduce the hardness of the multilayer hard films according to the first embodiment. Accordingly, the atomic ratios "A", "B", "C", "D", and "x" can be appropriately set according to the properties of Layer A or Layer B. In general, the atomic ratio "A" is 0.2 or more, preferably 0.25 or more, and more preferably 0.3 or more and is 0.5 or less and preferably 0.45 or less. One of the atomic ratios "B" and "C" can be zero, but both of them are not simultaneously zero. The total atomic ratio "B+C" is preferably more than 0.15, more preferably 0.2 or more, and further preferably 0.25 or more and is preferably 0.5 or less, more preferably 0.4 or less, and further preferably 0.3 or less. The atomic ratio "x" is 0.4 or more, preferably 0.6 or more, and more preferably 0.7 or more and is 1 or less.

Since Layer C does not require such high hardness as the hard films or the film of Layer A, it can have a crystal structure as a mixture of cubic crystals and hexagonal crystals or can be amorphous, as long as the desired hardness and oxidation resistance can be obtained. In this connection, "being amorphous" means having a grain size of 1 nm or less. More specifically, it means that no apparent peak is observed at 2θ of about 37.78°, about 43.9°, about 63.8°, about 32° to 33°, about 48° to 50°, and about 57° to about 58° in the X-ray diffraction.

In the multilayer hard films according to the first embodiment, the thickness of Layer A or B may be increased when importance is placed on the properties of Layer A or B, such as hardness. In contrast, the thickness of Layer C may be increased when importance is placed on the properties of Layer C, such as oxidation resistance. Particularly, by setting the thickness of Layer C about one half that of Layer A or Layer B, the strength (hardness) and oxidation resistance of the multilayer hard films according to the first embodiment can further be improved. The strength (hardness) and oxidation resistance of the multilayer hard films according to the first embodiment can further be improved by setting the thickness of Layer A or Layer B at 5 nm or more, preferably 10 nm or more, and more preferably 25 nm or more; and setting the thickness of Layer C at 1 nm or more, preferably 2 nm or more, and more preferably 3 nm or more. The periodical thickness of the multilayer, i.e., the total of the thickness of an optional Layer A or Layer B and the thickness of the adjacent Layer C, is preferably set at more than 10 nm. However, excessively thick Layer A, Layer B, or Layer C does not yield the advantages as the multilayer assemblage. Accordingly, the thickness of Layer A or Layer B is preferably 100 nm or less and more preferably 50 nm or less, and the thickness of Layer C is preferably 10 nm or less and more preferably 5 nm or less.

The total thickness of the multilayer hard films according to the first embodiment varies depending on the application and is, for example, about 1 to 10 μm when used in cutting tools.

3-2) Multilayer Hard Films According to the Second Embodiment

The multilayer hard films according to the second embodiment are hard films which comprise a total of two or more layers of a Layer S and a Layer T arranged alternately. The layer S comprises $[(Ti,Cr,V)_p(Nb,Ta)_q(Al,Si,B)_r](C_{1-x}N_x)$ and satisfies Conditions (1B) to (8B), and Layer T comprises $[(Ti,Cr,V)_p(Nb,Ta)_q(Al,Si,B)_r](C_{1-x}N_x)$ and satisfies Conditions (1C) to (8C).

In these hard films, Layer S has the same composition as the NbTaAl hard films according to the second embodiment. The compositional formula of Layer S is a made-up compositional formula of those of the Ti-free and Ti-containing NbTaAl hard films according to the second embodiment. In Layer S, the atomic ratio $p_{Ti}$ can be zero, and in this case the total atomic ratio $p_{Cr}+p_V$ is preferably more than zero. When $p_{Ti}$ is more than zero, the total atomic ratio $p_{Cr}+p_V+r_{Si}+r_B$ is preferably more than zero.

Layer T differs from Layer S in the following points. In Layer S, the total atomic ratio r of Al, Si and B, i.e., the total of $r_{Al}$, $r_{Si}$ and $r_B$, satisfies the following condition: $0.5 \leq r \leq 0.73$ as expressed by Condition (6A), and the total atomic ratio of Si and B, i.e., $r_{Si}+r_B$, satisfies the following condition: $0 \leq r_{Si}+r_B \leq 0.15$ as expressed by Condition (7A). In contrast, in Layer T, the total atomic ratio r of Al, Si and B, i.e., the total of $r_{Al}$, $r_{Si}$ and $r_B$, satisfies the following condition: $0.5 \leq r \leq 0.8$ as expressed by Condition (6C), and the total atomic ratio Si and B, i.e., $r_{Si}+r_B$, satisfies the condition: $0.15 \leq r_{Si}+r_B \leq 0.5$ as expressed by Condition (7C). The total atomic ratio $r_{Si}+r_B$ preferably satisfies the condition: $0.15 < r_{Si}+r_B \leq 0.5$.

Layer T can have a higher total content of Si and B ($r_{Si}+r_B$) and a higher total content of Al, Si, and B ($r_{Al}+r_{Si}+r_B$) than Layer S. Accordingly, $r_{Si}+r_B$ and $r_{Al}+r_{Si}+r_B$ in Layer T can be higher than $r_{Si}+r_B$ and $r_{Al}+r_{Si}+r_B$ in Layer S. Layer T is not limited to one having a cubic crystal structure but can be one having a hexagonal crystal or amorphous structure, and can have a lower hardness than Layer S. However, by allowing Layer T to have a higher total content of Si and B and a higher total content of Al, Si and B than Layer S, Layer T has higher oxidation resistance than Layer S. By alternately laminating a total of two or more layers of Layer S and Layer T, hard films having both satisfactory hardness and oxidation resistance can be obtained. Considering the both of hardness and oxidation resistance, the multilayer hard films according to the second embodiment have higher properties than the NbTaAl hard films according to the second embodiment. When the multilayer hard films according to the second embodiment and the NbTaAl hard films according to the second embodiment have hardness at the same level, the multilayer hard films according to the second embodiment can have more excellent oxidation resistance than the NbTaAl hard films according to the second embodiment. When they have oxidation resistance at the same level, the multilayer hard films according to the second embodiment can have higher hardness than the NbTaAl hard films according to the second embodiment.

For high hardness, the ratio in thickness of Layer S to Layer T is preferably one half or more in the multilayer hard films according to the second embodiment. Namely, Layer S preferably has a thickness two times or more as much as that of Layer T. For exhibiting the advantages as multilayer films, the periodic thickness, i.e., the total of the thickness of an optional Layer S and the thickness of the adjacent Layer T is preferably more than 10 nm; Layer S preferably has a thickness of 5 nm or more; and Layer T preferably has a thickness of 1 nm or more. For further exhibiting the advantages of multilayer films, it is more preferred that Layer S has a thickness of 10 nm or more and Layer T has a thickness of 2 nm or more. However, excessively large thickness of each layer significantly impair the advantages of multilayer structure, and the thicknesses of Layer S and Layer T are preferably 100 nm or less and 10 nm or less, respectively, and more preferably 50 nm or less and 5 nm or less, respectively.

The total thickness of the multilayer hard films according to the second embodiment is as in the multilayer hard films according to the first embodiment.

3) Production Methods

The hard films including the NbTaAl hard films according to the first and second embodiments and the multilayer hard films according to the first and second embodiments can be produced according to conventional procedures such as physical vapor deposition (PVD) or chemical vapor deposition (CVD). Typically from the viewpoint of adhesion, they are preferably produced by PVD. Specific examples of PVD techniques are sputtering, vacuum deposition, and ion plating. Among them, sputtering and ion plating are preferred. Targets for use in deposition of the hard films according to the present invention contain Nb and/or Ta in addition to Al. By electron beam evaporation or hollow cathode evaporation, the evaporation amounts of the elements Nb, Ta and Al in the targets cannot satisfactorily controlled due to significantly different melting points between Al and Nb or Ta. However, the evaporation rates of elements in sputtering or ion plating do not depend on their melting points. Ion plating techniques are more preferred, of which arc ion plating is typically preferred for higher deposition rates.

For example, hard films of single-layer structures, such as the NbTaAl hard films according to the first and second embodiments are preferably produced in the following manner. The NbTaAl hard films according to the first embodiment can be produced by cathode-discharge arc ion plating in a nitrogen-containing gas or a gaseous mixture containing carbon and nitrogen using a target comprising $[(Nb_{1-d},Ta_d)_a Al_{1-a}]$, wherein "a" and "d" each independently represent an atomic ratio and satisfy the following conditions: $0.4 \leq a \leq 0.6$, $0 \leq d \leq 1$, or a target comprising $[(Nb_{1-d},Ta_d)_a, Al_{1-a-b-c}, Si_b, B_c]$, wherein "a", "b", "c", and "d" each independently represent an atomic ratio and satisfy the following conditions: $0.4 \leq a \leq 0.6$, $0 < b+c \leq 0.15$, $0 \leq d \leq 1$, provided that one of "b" and "c" may be zero but both of them are not simultaneously zero.

The NbTaAl hard films according to the second embodiment can be produced by cathode-discharge arc ion plating in a nitrogen-containing gas or a gaseous mixture containing carbon and nitrogen using a target comprising $[(Cr,V)_p(Nb,Ta)_q(Al,Si,B)_r]$ and satisfying above-mentioned Conditions (1) to (7) or a target comprising $[(Ti,Cr,V)_p(Nb,Ta)_q(Al,Si,B)_r]$ and satisfying above-mentioned Conditions (1A) to (9A).

The cathode-discharge arc ion plating can be conducted with reference to the method described in JP-A No. 2003-7160.

The targets for depositing Layer C or Layer T of the multilayer hard films have higher contents of Si and/or B and thereby lower mechanical strength than the targets for depositing Layer A, Layer B, and Layer S. Therefore, if Layer C and Layer T are formed by cathode-discharge arc ion plating, the targets may be broken upon arc discharge. Additionally, Layer C and Layer T must have a relatively small thickness, but their thickness cannot significantly controlled in cathode-discharge arc ion plating because of very high deposition rates. For these reasons, Layer C and Layer T are preferably deposited by sputtering. The sputtering technique is free from the problem of target damage and can easily precisely control the film thickness. Accordingly, the multilayer hard films can be easily and conveniently deposited by alternately repeating the deposition of Layer A or Layer B, or Layer S by cathode-discharge arc ion plating and the deposition of Layer C or Layer T by sputtering.

Specifically, the multi layer hard films according to the first embodiment can be produced by alternately repeating the steps of:

depositing a film by cathode-discharge arc ion plating in a nitrogen-containing gas or a gaseous mixture containing carbon and nitrogen using a target comprising $[(Nb_{1-d},Ta_d)_a Al_{1-a}]$, wherein "a" and "d" each independently represent anatomic ratio and satisfy the following conditions: $0.4 \leq a \leq 0.6$ and $0 \leq d \leq 1$, or a target comprising $[(Nb_{1-d},Ta_d)_a, Al_{1-a-b-c},Si_b,B_c]$, wherein "a", "b", "c", and "d" each independently represent an atomic ratio and satisfy the following conditions: $0.4 \leq a \leq 0.6$, $0<b+c \leq 0.15$, and $0 \leq d \leq 1$, provided that one of "b" and "c" may be zero but both of them are not simultaneously zero; and depositing a film by sputtering in a nitrogen-containing gas or a gaseous mixture containing carbon and nitrogen using a target comprising $[(Nb_{1-D},Ta_D)_A,Al_{1-A-B-C}, Si_B, B_C]$, wherein "A", "B", "C", and "D" each independently represent an atomic ratio and satisfy the following conditions: $0.2 \leq A \leq 0.5$, $0.15<B+C \leq 0.5$, and $0 \leq D \leq 1$, provided that one of B and C may be zero but both of them are not simultaneously zero.

The multilayer hard films according to the second embodiment can be produced by alternately repeating the steps of:

depositing a Layer S by cathode-discharge arc ion plating in a nitrogen-containing gas or a gaseous mixture containing carbon and nitrogen using a target S comprising $[(Ti,Cr,V)_p(Nb,Ta)_q(Al,Si,B)_r]$ and satisfying above-mentioned Conditions (1B) to (7B); and depositing a Layer T by sputtering in a nitrogen-containing gas or a gaseous mixture containing carbon and nitrogen using a target T comprising $[(Ti,Cr,V)_p(Nb,Ta)_q(Al,Si,B)_r]$ and satisfying above-mentioned Conditions (1C) to (7C).

The nitrogen (N) content in the gaseous mixture can be controlled by appropriately adjusting the nitrogen and carbon contents of the gaseous mixture according typically to the composition of the desired hard film and deposition conditions. Argon (Ar) may be added to the gas herein as appropriate.

The multilayer hard films are preferably produced, for example, using the system described in Japanese Patent Application No. 2004-035474 (corresponding to JP-A No. 2005-226117). In this case, the multilayer hard films can be produced by using a deposition system including at least one arc evaporation source and at least one sputtering evaporation source, allowing the arc and sputtering evaporation sources to discharge simultaneously, and alternately repeating the steps of placing a work in the front of the arc evaporation source to deposit a first layer (Layer A or Layer B in the multilayer films according to the first embodiment, and Layer S in the multilayer hard films according to the second embodiment) by cathode-discharge arc ion plating, and placing the work in the front of the sputtering evaporation source to deposit a second layer (Layer C in the multilayer hard films according to the first embodiment, and Layer T in the multilayer hard films according to the second embodiment). According to this method, the first layer (Layer A or Layer B, or Layer S) and the second layer (Layer C or Layer T) can be alternately deposited by cathode-discharge arc ion plating and by sputtering, respectively, in a continuous manner, and thereby the multilayer hard films can be produced easily and conveniently. In addition, the target damage can be avoided, and the film thickness can be easily controlled precisely.

The methods for producing the multilayer hard films will be illustrated in further detail below with reference to FIG. 1. The system shown in FIG. 1 is a deposition system including two arc evaporation sources and two sputtering evaporation sources in one vacuum chamber. This system includes four rotatable tables 1 each carrying a substrate (work) (the filled circle in the figure) and being symmetrically arranged on a rotary table 9 in a chamber 8. On the circle around the tables 1 are arranged sputtering evaporation sources 2 and 3 facing each other and arc evaporation sources 5 and 6 facing each other. The sputtering evaporation sources 2 and 3 and the arc evaporation sources 5 and 6 are arranged alternately to as to adjacent each other.

By rotating the rotary table 9 and the tables 1 and thereby turning the substrates (works) (the filled circles in the figure), the substrates (works) are allowed to pass alternately the front of the arc evaporation sources 5 and 6 and the sputtering evaporation sources 2 and 3. In this system, the arc evaporation sources 5 and 6 and the sputtering evaporation sources 2 and 3 can be rotated around the substrates (works) (the filled circles in the figure) instead of rotating the rotary table 9 and the tables 1. As another embodiment, the sputtering evaporation sources 2 and 3 and the arc evaporation sources 5 and 6 may be arranged alternately in series, such as in a straight line manner, in the chamber 8 instead of arranging them on the circle, and the substrates (works) may be relatively moved between the arc evaporation sources and the sputtering evaporation sources sequentially.

Targets having the same composition as the first layer (Layer A or Layer B, or Layer S) are arranged as the arc evaporation sources 5 and 6, and targets having the same composition as the second layer (Layer C or Layer T) are arranged as the sputtering evaporation sources 2 and 3. The arc and sputtering evaporation sources are allowed to discharge simultaneously in an atmosphere containing a reactive gas, such as an argon-nitrogen atmosphere or argon-nitrogen-methane atmosphere. Thus, a multilayer hard film can be deposited by evaporating the components of the first layer (Layer A or Layer B, or Layer S) from the arc evaporation sources 5 and 6, evaporating the components of the second layer (Layer C or Layer T) from the sputtering evaporation sources 2 and 3 and depositing them on the substrate (work) alternately and sequentially.

The deposition system in FIG. 1 uses magnetic fields 10 generated and controlled by magnetic field application mechanisms 11 arranged near to the arc evaporation sources and the sputtering evaporation sources. Specifically, the deposition system in FIG. 1 shows an embodiment in which the film deposition is carried out while the magnetic fields 10 generated and controlled by the magnetic field application mechanisms 11 are linked to each other.

When the magnetic fields 10 of the arc and sputtering evaporation sources are linked to each other, the directivity of ions from the both evaporation sources is increased to increase ion application to the substrates (works) to thereby yield films having more excellent properties. Specifically, the magnetic fields 10 (lines of magnetic force) in the same deposition chamber 8 are closed (closed magnetic field structure). Therefore, emission electrons from the evaporation sources are trapped within the closed magnetic field structure and become resistant to the introduction to the chamber 8 which acts as an anode as the substrates (works). Consequently, the emission electrons have an increased concentration and come into collision with the sputtering gas and/or reactive gas more frequently to ionize the gas highly frequently.

In contrast, if the magnetic fields 10 of the arc and sputtering evaporation sources are not linked to each other and are isolated, the magnetic fields 10 (lines of magnetic force) in the same deposition chamber 8 constitute an open magnetic field structure, and emission electrons from the evaporation sources are easily and rapidly introduced to the chamber 8 along the directions of the individual magnetic fields 10 (lines of magnetic force). As a result, the emission electrons have a decreased concentration and come into collision with the sputtering gas and/or reactive gas less frequently, resulting in decreased ionization efficiency of the gas. Specifically, the directivity of ions from the arc and sputtering evaporation sources is reduced and the application of ions to the substrates (works) decreases. These may possibly impair the film properties and deposition efficiency.

The temperature of the work upon deposition can be selected according to the type of the work as appropriate but an excessively low deposition temperature may increase the residual stress of the resulting hard film. Such excessive residual stress in the hard film may impair adhesion with the work. It is therefore recommended to set the deposition temperature of the work at 300° C. or higher, and preferably at 400° C. or higher. In contrast, an excessively high temperature of the work upon deposition may reduce the residual stress but also reduce compressive stress simultaneously, failing to provide increased transverse rupture strength of the work. Additionally, such high temperatures may deform the work. Consequently, the temperature of the work is preferably 800° C. or lower, and more preferably 700° C. or lower. When a high-speed tool steel such as JIS SKH51, SKD11, or SKD61 steel is used as the work, the temperature of the work upon deposition is preferably set at the tempering temperature of the work or lower to thereby maintain mechanical properties of the work. The tempering temperature can be selected according to the type of the work as appropriate. The tempering temperatures are generally about 550° C. to about 570° C. in the case of JIS SKH51 steel, about 550° C. to about 680° C. in the case of JIS SKD61 steel, and about 500° C. to about 530° C. in the case of JIS SKD11 steel. The temperature of the work upon deposition is preferably set lower than these tempering temperatures. More specifically, it is preferably set 50° C. or more lower than the tempering temperature of the work used.

The hard films can be more efficiently deposited by applying a negative potential to the substrate (work) during deposition. With an increasing bias voltage, the energy of the film-forming gas and metal ions which have been converted into plasma increases to thereby rapidly yield hard films having cubic crystal structure. The negative bias voltage therefore has an absolute value of preferably 10 V or more and more preferably 30 V or more. An excessively great bias voltage, however, may invite etching of the hard film by the film-forming gas converted into plasma to thereby significantly reduce the deposition rate. The negative bias voltage has an absolute value of preferably 200 V or less and more preferably 150 V or less. At a relatively low content of Al, the ziehen effect effectively acts to easily yield hard films having a cubic crystal structure even at relatively low bias voltages.

The NbTaAl hard films according to the first embodiment and the multilayer hard films derived therefrom are very excellent in hardness and oxidation resistance because Al in aluminum nitride or aluminum carbonitride hard films is replaced with an appropriate amount of Nb and/or Ta. The NbTaAl hard films according to the second embodiment and the multilayer hard films derived therefrom have more excellent oxidation resistance and higher hardness than conventional TiAlN hard films and TiCrAlN hard films. These hard films according to the present invention can be advantageously used as hard films typically for tools and dies to thereby improve their durability.

EXAMPLES

The present invention will be illustrated in further detail with reference to several examples and comparative examples below. It is to be noted that the following are only examples which by no means limit the scope of the present invention, and various changes and modifications are possible therein without departing from the teaching and scope of the present invention.

The physical properties of hard films obtained in the following Experimental Examples were determined by the following methods.

[Composition of Hard Films]

The composition of metal elements in a sample film was measured by electron probe microanalysis (EPMA).

Oxygen and carbon are listed as impurity elements other than metal elements and nitrogen in hard films. The EPMA revealed that the contents of oxygen and carbon as impurities are 5 atomic percent or less, respectively.

[Crystal Structure]

The crystal structure of a sample film was determined by X-ray diffractometry. The detail analysis procedure is as follows.

Specifically, a sample hard film was subjected to X-ray diffractometry according to the θ-2θ method using a X-ray diffractometer (Rigaku Corporation). In X-ray diffractometry of a cubic crystal, peak intensities at 2θ of about 37.78° for the (111) plane, at 2θ of about 43.9° for the (200) plane, and at 2θ of about 63.8° for the (220) plane were measured using a Cu Kα ray source. In the X-ray diffractometry of a hexagonal crystal, the peak intensities at 2θ of about 32° to about 33° for the (100) plane, at 2θ of about 48° to about 50° for the (102) plane, and at 2θ of about 57° to about 58° for the (110) plane were measured using Cu Kα ray. Based on these peak intensities, the value of following Expression (1) was calculated, and the crystal structure of the sample film was determined according to the following criteria.

$$\frac{IB(111) + IB(200) + IB(220)}{IB(111) + IB(200) + IB(220) + IH(100) + IH(102) + IH(110)} \quad (1)$$

In Expression (1), IB(111), IB(200), and IB(220) each represent the peak intensities of the planes of a cubic crystal; and IH(100), IH(102), and IH(110) each represent the peak intensities of the planes of a hexagonal crystal.

If the value of Expression (1) is 0.8 or more, the sample film is evaluated to comprise cubic crystals (sodium chloride or rock-salt structure) and indicated by "B" in the following tables.

If the value of Expression (1) is 0, the sample film is evaluated to comprise hexagonal crystals (wurtzite structure or ZnS structure) and indicated by "H" in the following tables.

If the value of Expression (1) is more than 0 and less than 0.8, the sample film is evaluated to have a mixed structure and indicated by "B+H" in the following tables.

If the sample film shows no clear peaks at 2θ of about 37.78°, about 43.9°, about 63.8°, about 32° to 33°, about 48° to 50°, and about and 57° to 58°, the film is evaluated as amorphous and indicated by "a" in the following tables.

[Hardness]

The hardness of a sample was determined using a micro Vickers hardness tester at a load of 0.25 N for a holding time of 15 seconds.

[Oxidation Starting Temperature]

A hard film was deposited on platinum foil to yield a sample (platinum sample). The platinum sample was heated in an artificial dry atmosphere from room temperature at a temperature elevation rate of 5° C./min in a thermobalance. In this procedure, the temperature at which the weight of the platinum sample first changed was defined as the oxidation starting temperature.

[Wear Width (Wear Resistance)]

A sample film was deposited on a cemented carbide two-flute end mill (diameter: 10 mm) to yield a sample. The sample was used for cutting JIS SKD11 hardened steel (HRC60) ten meters under the following cutting conditions, the cutting edges of the end mill covered with the hard film was observed under an optical microscope, and the wear width of the center of cutting edges was measured as an index of wear resistance.

Cutting speed: 150 m/min.

Skip interval: 0.4 mm/edge

Axial depth of cut: 4.5 mm

Radial depth of cut: 0.2 mm

Other conditions: down cutting, dry cutting, air blow alone

[Type of Work]

In the following Experimental Examples, (I) a cemented carbide tip for the determination of crystal structure and hardness, (II) a cemented carbide ball end mill (diameter 10 mm, two-flute) for the determination of wear width, and (III) a platinum foil (30 mm long, 5 mm wide and 0.1 mm thick) for the determination of oxidation starting temperature were used as works (substrates).

Experimental Example 1

Targets having the compositions of "Composition of target (atomic ratio)" in Table 1 were placed onto the arc evaporation sources 5 and 6 of the deposition system shown in FIG. 1, the three works (substrates) [cemented carbide tip, cemented carbide ball end mill, platinum foil (30 mm long, 5 mm wide and 0.1 mm thick)] were arranged onto the tables 1, and the chamber 8 was evacuated. The works were then heated to a temperature of 500° C. using a heater in the chamber 8, a film-forming gas was introduced to an inside pressure of the chamber 8 of 2.7 Pa, arc discharge was initiated, and a film 3 μm thick was deposited on each substrate (work). During deposition, a bias voltage of 20 to 100 V was applied to the substrates (works) so as to render the substrates (works) have negative potentials with respect to the ground potential. The rotary table 9 and the tables 1 were fixed without rotation.

The crystal structures, hardness, oxidation starting temperatures, and wear widths of the resulting hard films were determined, and the results are shown in Table 1. The physical properties of a conventional TiAlN hard film (Comparative Example 1) and a conventional CrAlN hard film (Comparative Example 2) are also shown in Table 1 as a comparison.

TABLE 1

| | Composition of target (atomic ratio) | | | Composition of film-forming gas (atomic ratio) | | Crystal structure | Grain size (nm) | Hardness (HV) | Oxidation starting temperature (° C.) | Wear width (μm) |
|---|---|---|---|---|---|---|---|---|---|---|
| | Nb | Ta | (Nb + Ta) | Al | C | N | | | | | |
| Comparative Example | | | | | | | | | | | |
| 1 | | | | $Ti_{0.4}Al_{0.6}N$ | | | B | 50 | 2800 | 850 | 100.0 |
| 2 | | | | $Cr_{0.4}Al_{0.6}N$ | | | B | 40 | 2750 | 900 | 120.0 |
| 3 | 0.00 | 0.20 | 0.20 | 0.80 | 0.00 | 1.00 | H | 30 | 2400 | 1000 | 130.0 |
| 4 | 0.30 | 0.00 | 0.30 | 0.70 | 0.00 | 1.00 | H | 35 | 2500 | 1000 | 125.0 |
| 5 | 0.70 | 0.00 | 0.70 | 0.30 | 0.00 | 1.00 | B | 50 | 2800 | 930 | 125.0 |
| 6 | 0.50 | 0.00 | 0.50 | 0.50 | 0.70 | 0.30 | B | 46 | 2870 | 900 | 110.0 |
| Example | | | | | | | | | | | |
| 1 | 0.00 | 0.45 | 0.45 | 0.55 | 0.00 | 1.00 | B | 40 | 2950 | 970 | 95.0 |
| 2 | 0.50 | 0.00 | 0.50 | 0.50 | 0.00 | 1.00 | B | 40 | 2950 | 980 | 94.0 |
| 3 | 0.50 | 0.00 | 0.50 | 0.50 | 0.50 | 0.50 | B | 45 | 2910 | 980 | 94.0 |
| 4 | 0.30 | 0.20 | 0.50 | 0.50 | 0.00 | 1.00 | B | 40 | 2900 | 970 | 92.0 |
| 5 | 0.30 | 0.20 | 0.50 | 0.50 | 0.20 | 0.80 | B | 40 | 2950 | 950 | 90.0 |

The hard films according to the present invention (Examples 1 to 5) are more excellent in hardness, oxidation resistance (evaluated based on the oxidation starting temperature) and wear resistance (evaluated based on the wear width) than the conventional hard films (Comparative Examples 1 and 2). The hard films having compositions out of the specified range in the present invention (Comparative Examples 3 to 6) are poor in any of hardness, oxidation resistance (evaluated based on the oxidation starting temperature) and wear resistance (evaluated based on the wear width) as compared with the conventional hard films and the hard films according to the present invention.

Experimental Example 2

Hard films were prepared by the procedure of Experimental Example 1, except for using targets having the compositions of "Composition of target (atomic ratio)" in Table 2 as the arc evaporation sources 5 and 6.

The crystal structures, hardness, oxidation starting temperatures, and wear widths of the resulting hard films were determined, and the results are shown in Table 2. The physical properties of a conventional TiAlN hard film (Comparative Example 1) and a conventional CrAlN hard film (Comparative Example 2) are also shown in Table 1 as a comparison.

TABLE 2

| | Composition of target (atomic ratio) | | | | | | | Composition of film-forming gas (atomic ratio) | | Crystal structure | Grain size (nm) | Hardness (HV) | Oxidation starting temperature (° C.) | Wear width (μm) |
|---|---|---|---|---|---|---|---|---|---|---|---|---|---|---|
| | Nb | Ta | (Nb + Ta) | Al | Si | B | (Al + Si + B) | C | N | | | | | |
| Comparative Example | | | | | | | | | | | | | | |
| 1 | | | | $Ti_{0.4}Al_{0.6}N$ | | | | | | B | 50 | 2800 | 850 | 100.0 |
| 2 | | | | $Cr_{0.4}Al_{0.6}N$ | | | | | | B | 40 | 2750 | 900 | 120.0 |
| 7 | 0.00 | 0.45 | 0.45 | 0.37 | 0.18 | 0.00 | 0.55 | 0.00 | 1.00 | H | 5 | 2800 | 1300 | 105.0 |
| 8 | 0.45 | 0.00 | 0.45 | 0.37 | 0.00 | 0.18 | 0.55 | 0.00 | 1.00 | H | 5 | 2750 | 1150 | 113.0 |
| 9 | 0.00 | 0.65 | 0.65 | 0.30 | 0.05 | 0.00 | 0.35 | 0.00 | 1.00 | B | 12 | 2900 | 900 | 106.0 |
| 10 | 0.00 | 0.35 | 0.35 | 0.60 | 0.05 | 0.00 | 0.65 | 0.00 | 1.00 | H | 5 | 2800 | 1250 | 115.0 |
| 11 | 0.47 | 0.00 | 0.47 | 0.48 | 0.00 | 0.05 | 0.53 | 0.65 | 0.35 | B | 7 | 2900 | 900 | 109.0 |
| Example | | | | | | | | | | | | | | |
| 1 | 0.00 | 0.45 | 0.45 | 0.55 | 0.00 | 0.00 | 0.55 | 0.00 | 1.00 | B | 40 | 2950 | 970 | 95.0 |
| 6 | 0.00 | 0.45 | 0.45 | 0.53 | 0.02 | 0.00 | 0.55 | 0.00 | 1.00 | B | 15 | 3000 | 1100 | 80.0 |
| 7 | 0.00 | 0.45 | 0.45 | 0.50 | 0.05 | 0.00 | 0.55 | 0.00 | 1.00 | B | 10 | 3200 | 1200 | 60.0 |
| 8 | 0.00 | 0.45 | 0.45 | 0.43 | 0.12 | 0.00 | 0.55 | 0.00 | 1.00 | B | 10 | 3150 | 1250 | 65.0 |
| 9 | 0.00 | 0.48 | 0.48 | 0.48 | 0.05 | 0.00 | 0.53 | 0.00 | 1.00 | B | 7 | 3100 | 1200 | 70.0 |
| 10 | 0.45 | 0.00 | 0.45 | 0.53 | 0.00 | 0.02 | 0.55 | 0.00 | 1.00 | B | 15 | 2850 | 970 | 85.0 |
| 11 | 0.45 | 0.00 | 0.45 | 0.50 | 0.00 | 0.05 | 0.55 | 0.00 | 1.00 | B | 10 | 3100 | 1050 | 77.0 |
| 12 | 0.45 | 0.00 | 0.45 | 0.43 | 0.00 | 0.12 | 0.55 | 0.00 | 1.00 | B | 7 | 3100 | 1100 | 79.0 |
| 13 | 0.47 | 0.00 | 0.47 | 0.48 | 0.00 | 0.05 | 0.53 | 0.00 | 1.00 | B | 6 | 3100 | 1050 | 77.0 |
| 14 | 0.47 | 0.00 | 0.47 | 0.48 | 0.00 | 0.05 | 0.53 | 0.20 | 0.80 | B | 8 | 3150 | 1000 | 77.0 |
| 15 | 0.47 | 0.00 | 0.47 | 0.48 | 0.00 | 0.05 | 0.53 | 0.35 | 0.65 | B | 7 | 3100 | 970 | 85.0 |
| 16 | 0.47 | 0.00 | 0.47 | 0.48 | 0.00 | 0.05 | 0.53 | 0.55 | 0.45 | B | 7 | 3050 | 970 | 87.0 |

TABLE 2-continued

| | Composition of target (atomic ratio) | | | | | | Composition of film-forming gas (atomic ratio) | | Crystal struc-ture | Grain size (nm) | Hardness (HV) | Oxidation starting temperature (° C.) | Wear width (μm) |
|---|---|---|---|---|---|---|---|---|---|---|---|---|---|
| | Nb | Ta | (Nb + Ta) | Al | Si | B | (Al + Si + B) | C | N | | | | | |
| 17 | 0.00 | 0.47 | 0.47 | 0.48 | 0.03 | 0.02 | 0.53 | 0.00 | 1.00 | B | 7 | 3200 | 1250 | 68.0 |
| 18 | 0.24 | 0.24 | 0.48 | 0.45 | 0.07 | 0.00 | 0.52 | 0.00 | 1.00 | B | 8 | 3150 | 1250 | 63.0 |

The hard films according to the present invention (Examples 6 to 18) are more excellent in hardness, oxidation resistance (evaluated based on the oxidation starting temperature) and wear resistance (evaluated based on the wear width) than the conventional hard films (Comparative Examples 1 and 2). By further comprising Si and/or B, the hard films (Examples 6 to 8) have further improved hardness, oxidation resistance and wear resistance as compared with the hard film (Example 1) which does not further comprise Si and B. The hard films having compositions out of the specified range in the present invention (Comparative Examples 7 to 11) are poor in any of hardness, oxidation resistance and wear resistance as compared with the conventional hard films and the hard films according to the present invention.

Experimental Example 3

Targets having the compositions of the upper row (Layer A or Layer B) of "Composition of target (atomic ratio)" in Table 3 were mounted to the arc evaporation sources 5 and 6, and targets having the compositions of the lower row (Layer C) of "Composition of target (atomic ratio)" in Table 1 were mounted to the sputtering evaporation source 2 and 3 of the deposition system shown in FIG. 1. The three works (substrates) [cemented carbide tip, cemented carbide ball end mill, and platinum foil (30 mm long, 5 mm wide and 0.1 mm thick)] were mounted to the tables 1. The chamber 8 was then evacuated. The works were heated to a temperature of 500° C. using a heater in the chamber 8, and a 1:1 gaseous mixture of a film-forming gas and argon gas was introduced to an inner pressure of the chamber of 2.7 Pa, arc discharge and sputtering discharge were initiated simultaneously, and films having predetermined thicknesses as indicated in Table 3 were deposited on the substrates (works) while rotating the works (substrates) by the rotation of the rotary table 9 and the tables 1. During deposition, a bias voltage of 20 to 100 V was applied to the substrates (works) so as to render the substrates (works) be negative potentials with respect to the ground potential.

The crystal structures, hardness, oxidation starting temperatures, and wear widths of the resulting hard films are shown in Table 3. As a comparison, the physical properties of a conventional TiAlN hard film (Comparative Example 1) and a conventional CrAlN hard film (Comparative Example 2), and the hard films according to the present invention having a single layer structure (Examples 19 to 21) are also shown in Table 3.

TABLE 3

| | Layer A or B (upper row)/Layer C (lower row) | | | | | | | Thickness (nm) | Total thickness (nm) |
|---|---|---|---|---|---|---|---|---|---|
| | Compositional ratio of target (atomic ratio) | | | | | | | | |
| | Nb | Ta | (Nb + Ta) | Al | Si | B | (Al + Si + B) | | |
| Comparative Example | | | | | | | | | |
| 1 | | | | Ti$_{0.4}$Al$_{0.6}$ | | | | | 3000 |
| 2 | | | | Cr$_{0.4}$Al$_{0.6}$ | | | | | 3000 |
| 12 | 0.00 | 0.50 | 0.50 | 0.45 | 0.05 | 0.00 | 0.50 | 25.00 | 3000 |
| | 0.00 | 0.09 | 0.09 | 0.65 | 0.26 | 0.00 | 0.91 | 5.00 | |
| 13 | 0.00 | 0.50 | 0.50 | 0.45 | 0.05 | 0.00 | 0.50 | 25.00 | 3000 |
| | 0.00 | 0.25 | 0.25 | 0.10 | 0.65 | 0.00 | 0.75 | 5.00 | |
| 14 | 0.00 | 0.50 | 0.50 | 0.45 | 0.50 | 0.00 | 0.50 | 25.00 | 3000 |
| | 0.00 | 0.50 | 0.50 | 0.45 | 0.05 | 0.00 | 0.50 | 5.00 | |
| Example | | | | | | | | | |
| 19 | 0.00 | 0.50 | 0.50 | 0.45 | 0.05 | 0.00 | 0.50 | 3000 | 3000 |
| 20 | 0.49 | 0.00 | 0.49 | 0.46 | 0.00 | 0.05 | 0.51 | 3000 | 3000 |
| 21 | 0.00 | 0.47 | 0.47 | 0.48 | 0.03 | 0.02 | 0.53 | 3000 | 3000 |
| 22 | 0.00 | 0.50 | 0.50 | 0.45 | 0.05 | 0.00 | 0.50 | 25.00 | 3000 |
| | 0.00 | 0.50 | 0.50 | 0.45 | 0.05 | 0.00 | 0.50 | 5.00 | |
| 23 | 0.00 | 0.50 | 0.50 | 0.45 | 0.05 | 0.00 | 0.50 | 25.00 | 3000 |
| | 0.00 | 0.45 | 0.45 | 0.45 | 0.20 | 0.00 | 0.65 | 5.00 | |
| 24 | 0.00 | 0.50 | 0.50 | 0.45 | 0.05 | 0.00 | 0.50 | 25.00 | 3000 |
| | 0.00 | 0.22 | 0.22 | 0.50 | 0.28 | 0.00 | 0.78 | 5.00 | |
| 25 | 0.00 | 0.50 | 0.50 | 0.45 | 0.50 | 0.00 | 0.50 | 25.00 | 3000 |
| | 0.00 | 0.28 | 0.28 | 0.37 | 0.35 | 0.00 | 0.72 | 5.00 | |
| 26 | 0.00 | 0.50 | 0.50 | 0.45 | 0.05 | 0.00 | 0.50 | 25.00 | 3000 |
| | 0.30 | 0.20 | 0.50 | 0.05 | 0.30 | 0.15 | 0.50 | 5.00 | |

TABLE 3-continued

| | | | | | | | | | |
|---|---|---|---|---|---|---|---|---|---|
| 27 | 0.49 | 0.00 | 0.49 | 0.46 | 0.00 | 0.05 | 0.51 | 25.00 | 3000 |
| | 0.35 | 0.00 | 0.35 | 0.35 | 0.00 | 0.30 | 0.65 | 5.00 | |
| 28 | 0.49 | 0.00 | 0.49 | 0.46 | 0.00 | 0.05 | 0.51 | 25.00 | 3000 |
| | 0.00 | 0.22 | 0.22 | 0.50 | 0.28 | 0.00 | 0.78 | 5.00 | |
| 29 | 0.00 | 0.50 | 0.50 | 0.45 | 0.05 | 0.00 | 0.50 | 2.00 | 3000 |
| | 0.00 | 0.22 | 0.22 | 0.50 | 0.28 | 0.00 | 0.78 | 10.00 | |
| 30 | 0.00 | 0.50 | 0.50 | 0.45 | 0.05 | 0.00 | 0.50 | 10.00 | 2990 |
| | 0.00 | 0.22 | 0.22 | 0.50 | 0.28 | 0.00 | 0.78 | 3.00 | |
| 31 | 0.00 | 0.50 | 0.50 | 0.45 | 0.05 | 0.00 | 0.50 | 500.00 | 2510 |
| | 0.00 | 0.22 | 0.22 | 0.50 | 0.28 | 0.00 | 0.78 | 2.00 | |
| 32 | 0.00 | 0.50 | 0.50 | 0.45 | 0.05 | 0.00 | 0.50 | 25.00 | 3000 |
| | 0.00 | 0.50 | 0.50 | 0.45 | 0.05 | 0.00 | 0.50 | 5.00 | |

| | Composition of film-forming gas (atomic ratio) | | Number of layers | Crystal structure | Hardness (HV) | Oxidation starting temperature (° C.) | Wear width (μm) |
|---|---|---|---|---|---|---|---|
| | C | N | | | | | |
| Comparative Example | | | | | | | |
| 1 | 0.00 | 1.00 | 1 | B | 2800 | 850 | 100.0 |
| 2 | 0.00 | 1.00 | 1 | B | 2750 | 900 | 120.0 |
| 12 | 0.00 | 1.00 | 100 | Ba | 2900 | 1350 | 105.0 |
| 13 | 0.00 | 1.00 | 100 | Ba | 2800 | 1350 | 106.0 |
| 14 | 0.75 | 0.25 | 100 | BB | 3000 | 1050 | 110.0 |
| Example | | | | | | | |
| 19 | 0.00 | 1.00 | 1 | B | 3200 | 1200 | 63.0 |
| 20 | 0.00 | 1.00 | 1 | B | 3100 | 1050 | 77.0 |
| 21 | 0.00 | 1.00 | 1 | B | 3200 | 1250 | 68.0 |
| 22 | 0.00 | 1.00 | 100 | BB | 3200 | 1200 | 63.0 |
| 23 | 0.00 | 1.00 | 100 | Ba | 3100 | 1250 | 59.0 |
| 24 | 0.00 | 1.00 | 100 | Ba | 3050 | 1300 | 65.0 |
| 25 | 0.00 | 1.00 | 100 | Ba | 3000 | 1300 | 68.0 |
| 26 | 0.00 | 1.00 | 100 | Ba | 3100 | 1200 | 69.0 |
| 27 | 0.00 | 1.00 | 100 | Ba | 3100 | 1100 | 71.0 |
| 28 | 0.00 | 1.00 | 100 | Ba | 3150 | 1250 | 63.0 |
| 29 | 0.00 | 1.00 | 250 | Ba | 2900 | 1200 | 95.0 |
| 30 | 0.00 | 1.00 | 230 | Ba | 3100 | 1250 | 85.0 |
| 31 | 0.00 | 1.00 | 5 | Ba | 3000 | 1100 | 88.0 |
| 32 | 0.30 | 0.70 | 100 | BB | 3150 | 1100 | 75.0 |

The multilayer hard films according to the present invention (Examples 23 to 31) are more excellent in hardness, oxidation resistance and wear resistance than the conventional hard films (Comparative Examples 1 and 2). The multilayer hard films having compositions out of the range specified in the present invention (Comparative Examples 12 to 14) are poorer in hardness and/or wear resistance than the multilayer hard films according to the present invention and they are poorer in wear resistance than the conventional hard films (Comparative Examples 1 and 2). By configuring a multilayer structure, the multilayer hard films (Examples 23 to 28) have further improved oxidation resistance (oxidation starting temperature) without significant reduction in hardness as compared with the single layer hard films (Examples 19 and 20). The multilayer films of Examples 22 and 32 comprising plural layers having the same composition are excellent in oxidation resistance and wear resistance.

Experimental Example 4

Hard films were produced by the procedure of Experimental Example 1, except for using the targets having the compositions $(Ti,Cr,V)_p(Nb,Ta)_q(Al,Si,B)_r$ in Table 4 as the arc evaporation sources 5 and 6.

The crystal structures, hardness, oxidation starting temperatures and wear widths of the resulting hard films are shown in Table 4. As a comparison, the physical properties of a conventional TiAlN hard film (Sample No. 1), a conventional TiCrAlN hard film (Sample No. 2), and a conventional TiVAlN hard film (Sample No. 3) are also shown in Table 4.

TABLE 4

| Sample No. | Composition of film (atomic ratio) | | | | | | | | | | | | | Crystal structure | Hardness (HV) | Oxidation starting temperature (°C.) | Wear width (μm) | Remarks |
|---|---|---|---|---|---|---|---|---|---|---|---|---|---|---|---|---|---|---|
| | Ti | Cr | V | p | Nb | Ta | q | Al | Si | B | r | C | N | | | | | |
| 1 | | | | | | $Ti_{0.5}Al_{0.5}N$ | | | | | | | | B | 2800 | 850 | 150.0 | Comparative Sample |
| 2 | | | | | | $(Ti_{0.2}Cr_{0.15}Al_{0.65})N$ | | | | | | | | B | 3000 | 950 | 110.0 | Comparative Sample |
| 3 | | | | | | $(Ti_{0.2}V_{0.15}Al_{0.65})N$ | | | | | | | | B | 3000 | 800 | 115.0 | Comparative Sample |
| 4 | 0.3 | 0 | 0 | 0.3 | 0.00 | 0.25 | 0.25 | 0.45 | 0.00 | 0.00 | 0.45 | 0.00 | 1.00 | B | 2950 | 900 | 113.0 | Comparative Sample |
| 5 | 0 | 0.25 | 0 | 0.25 | 0.00 | 0.10 | 0.10 | 0.65 | 0.00 | 0.00 | 0.65 | 0.00 | 1.00 | B | 3250 | 1100 | 79.0 | Inventive Sample |
| 6 | 0 | 0.23 | 0 | 0.23 | 0.00 | 0.07 | 0.07 | 0.70 | 0.00 | 0.00 | 0.70 | 0.00 | 1.00 | B | 3200 | 1150 | 78.0 | Inventive Sample |
| 7 | 0 | 0 | 0.2 | 0.2 | 0.00 | 0.03 | 0.03 | 0.77 | 0.00 | 0.00 | 0.77 | 0.00 | 1.00 | H | 2800 | 800 | 125.0 | Comparative Sample |
| 8 | 0 | 0.23 | 0 | 0.23 | 0.15 | 0.00 | 0.15 | 0.62 | 0.00 | 0.00 | 0.62 | 0.00 | 1.00 | B | 3250 | 1150 | 75.0 | Inventive Sample |
| 9 | 0 | 0 | 0.15 | 0.15 | 0.25 | 0.00 | 0.25 | 0.60 | 0.00 | 0.00 | 0.60 | 0.00 | 1.00 | B | 3300 | 1000 | 78.0 | Inventive Sample |
| 10 | 0.13 | 0.13 | 0 | 0.26 | 0.16 | 0.00 | 0.16 | 0.58 | 0.00 | 0.00 | 0.58 | 0.00 | 1.00 | B | 3300 | 1150 | 74.0 | Inventive Sample |
| 11 | 0.27 | 0 | 0 | 0.27 | 0.15 | 0.00 | 0.15 | 0.53 | 0.05 | 0.00 | 0.58 | 0.00 | 1.00 | B | 3300 | 1250 | 72.0 | Inventive Sample |
| 12 | 0.27 | 0 | 0 | 0.27 | 0.15 | 0.00 | 0.15 | 0.47 | 0.11 | 0.00 | 0.58 | 0.00 | 1.00 | B | 3200 | 1300 | 97.0 | Inventive Sample |
| 13 | 0.27 | 0 | 0 | 0.27 | 0.15 | 0.00 | 0.15 | 0.39 | 0.19 | 0.00 | 0.58 | 0.00 | 1.00 | H | 2900 | 1300 | 105.0 | Comparative Sample |
| 14 | 0 | 0.23 | 0 | 0.23 | 0.15 | 0.00 | 0.15 | 0.60 | 0.00 | 0.02 | 0.62 | 0.00 | 1.00 | B | 3250 | 1200 | 73.0 | Inventive Sample |
| 15 | 0 | 0.23 | 0 | 0.23 | 0.15 | 0.00 | 0.15 | 0.55 | 0.00 | 0.07 | 0.62 | 0.00 | 1.00 | B | 3300 | 1250 | 71.0 | Inventive Sample |
| 16 | 0 | 0.23 | 0 | 0.23 | 0.15 | 0.00 | 0.15 | 0.41 | 0.00 | 0.21 | 0.62 | 0.00 | 1.00 | H | 2900 | 1250 | 115.0 | Comparative Sample |
| 17 | 0.13 | 0.13 | 0 | 0.26 | 0.16 | 0.00 | 0.16 | 0.53 | 0.03 | 0.02 | 0.58 | 0.00 | 1.00 | B | 3350 | 1300 | 69.0 | Inventive Sample |
| 18 | 0 | 0.23 | 0 | 0.23 | 0.15 | 0.00 | 0.15 | 0.62 | 0.00 | 0.00 | 0.62 | 0.30 | 0.70 | B | 3300 | 1100 | 76.0 | Inventive Sample |
| 19 | 0 | 0.23 | 0 | 0.23 | 0.15 | 0.00 | 0.15 | 0.62 | 0.00 | 0.00 | 0.62 | 0.50 | 0.50 | B | 3250 | 1150 | 75.0 | Inventive Sample |
| 20 | 0 | 0.23 | 0 | 0.23 | 0.15 | 0.00 | 0.15 | 0.62 | 0.00 | 0.00 | 0.62 | 0.80 | 0.20 | B | 3000 | 1050 | 95.0 | Comparative Sample |
| 21 | 0 | 0.23 | 0 | 0.23 | 0.10 | 0.05 | 0.15 | 0.57 | 0.05 | 0.00 | 0.62 | 0.00 | 1.00 | B | 3300 | 1300 | 70.0 | Inventive Sample |

Table 4 shows that the films of Sample Nos. 4, 7, 13, 16, and 20 (Comparative Samples) have higher oxidation resistance or hardness and smaller wear widths (higher wear resistance) than the conventional hard films, but they are still insufficient.

In contrast, the films of Sample Nos. 5, 6, 8 to 12, 14 to 15, 17 to 19, and 21 have sufficiently high oxidation resistance, high hardness and small wear widths (high wear resistance).

Experimental Example 5

A series of films each 3 μm thick was deposited on the substrates (works) 1 by the procedure of Experimental Example 3, except for mounting targets having the metal compositions of Layer S in Table 5 as the arc evaporation sources 5 and 6, and targets having the metal compositions of Layer T in Table 5 as the sputtering evaporation sources 2 and 3. The composition of Layer S in Sample Nos. 4 to 13 is $[Ti_{0.27}Nb_{0.15}Al_{0.56}Si_{0.02}]N$.

The crystal structures, hardness, oxidation starting temperatures and wear widths of the resulting hard films were determined and are shown in Table 5. As a comparison, the physical properties of a conventional TiAlN hard film (Sample No. 1), a conventional TiCrAlN hard film (Sample No. 2), a conventional TiVAlN hard film (Sample No. 3), and a single-layer hard film according to the present invention $[Ti_{0.27}Nb_{0.15}Al_{0.56}Si_{0.02}]N$ are also shown in Table 5.

TABLE 5

| Sample No. | Composition of Layer T (atomic ratio) | | | | | | | | | | | | | Thickness of Layer S (nm) |
|---|---|---|---|---|---|---|---|---|---|---|---|---|---|---|
| | Ti | Cr | V | p | Nb | Ta | q | Al | Si | B | r | C | N | |
| 1 | Ti0.5Al0.5N: Layer S alone | | | | | | | | | | | | | 3000.0 |
| 2 | (Ti0.2Cr0.15Al0.65)N: Layer S alone | | | | | | | | | | | | | 3000.0 |
| 3 | (Ti0.2V0.15Al0.65)N: Layer S alone | | | | | | | | | | | | | 3000.0 |
| | (Ti0.27Nb0.15Al0.56Si0.02)N: Layer S alone | | | | | | | | | | | | | 3000.0 |
| 4 | 0.2 | 0.2 | 0 | 0.4 | 0.00 | 0.25 | 0.25 | 0.30 | 0.05 | 0.00 | 0.35 | 0.00 | 1.00 | 25.00 |
| 5 | 0 | 0.23 | 0 | 0.23 | 0.00 | 0.20 | 0.20 | 0.52 | 0.05 | 0.00 | 0.57 | 0.00 | 1.00 | 25.00 |
| 6 | 0.15 | 0 | 0 | 0.15 | 0.10 | 0.00 | 0.10 | 0.65 | 0.05 | 0.05 | 0.75 | 0.00 | 1.00 | 25.00 |
| 7 | 0.05 | 0 | 0 | 0.05 | 0.10 | 0.00 | 0.10 | 0.80 | 0.05 | 0.00 | 0.85 | 0.00 | 1.00 | 25.00 |
| 8 | 0.15 | 0 | 0 | 0.15 | 0.10 | 0.00 | 0.10 | 0.50 | 0.20 | 0.05 | 0.75 | 0.00 | 1.00 | 25.00 |
| 9 | 0.15 | 0 | 0 | 0.15 | 0.10 | 0.00 | 0.10 | 0.35 | 0.35 | 0.05 | 0.75 | 0.00 | 1.00 | 25.00 |
| 10 | 0.15 | 0 | 0 | 0.15 | 0.10 | 0.00 | 0.10 | 0.20 | 0.50 | 0.05 | 0.75 | 0.00 | 1.00 | 25.00 |
| 11 | 0 | 0.23 | 0 | 0.23 | 0.00 | 0.20 | 0.20 | 0.52 | 0.05 | 0.00 | 0.57 | 0.00 | 1.00 | 25.00 |
| 12 | 0 | 0.23 | 0 | 0.23 | 0.00 | 0.20 | 0.20 | 0.52 | 0.05 | 0.00 | 0.57 | 0.00 | 1.00 | 1.00 |
| 13 | 0 | 0.23 | 0 | 0.23 | 0.00 | 0.20 | 0.20 | 0.52 | 0.05 | 0.00 | 0.57 | 0.00 | 1.00 | 50.00 |
| 14 | 0 | 0.23 | 0 | 0.23 | 0.00 | 0.20 | 0.20 | 0.52 | 0.05 | 0.00 | 0.57 | 0.00 | 1.00 | 200.00 |

| Sample No. | Crystal structure of Layer S | Thickness of Layer T (nm) | Number of layers | Crystal structure of Layer T | Hardness (HV) | Oxidation starting temperature (°C.) | Wear width (μm) | Remark |
|---|---|---|---|---|---|---|---|---|
| 1 | B | — | 1 | — | 2800 | 850 | 150.0 | Comparative Sample |
| 2 | B | — | 1 | — | 3000 | 950 | 110.0 | Comparative Sample |
| 3 | B | — | 1 | — | 3000 | 800 | 115.0 | Comparative Sample |
| | B | — | 1 | — | 3300 | 1250 | 72.0 | Inventive Sample |
| 4 | B | 5.00 | 100 | B | 3050 | 1250 | 84.0 | Inventive Sample |
| 5 | B | 5.00 | 100 | B | 3250 | 1300 | 70.0 | Inventive Sample |
| 6 | B | 5.00 | 100 | a | 3250 | 1350 | 70.0 | Inventive Sample |
| 7 | B | 5.00 | 100 | a | 3000 | 1350 | 105.0 | Comparative Sample |
| 8 | B | 5.00 | 100 | a | 3250 | 1350 | 69.0 | Inventive Sample |
| 9 | B | 5.00 | 100 | a | 3250 | 1400 | 69.0 | Inventive Sample |
| 10 | B | 5.00 | 100 | a | 2900 | 1400 | 95.0 | Inventive Sample |
| 11 | B | 0.05 | 119 | B | 3250 | 1200 | 81.0 | Inventive Sample |
| 12 | B | 10.0 | 272 | B | 3000 | 1250 | 89.0 | Inventive Sample |
| 13 | B | 5.00 | 54 | B | 3200 | 1300 | 76.0 | Inventive Sample |
| 14 | B | 50.0 | 12 | B | 3100 | 1300 | 85.0 | Inventive Sample |

Remarks: The composition of Layer S in Sample Nos. 4 to 14 is (Ti0.27Nb0.15Al0.56Si0.02)N Table 5 shows that the film of Sample No. 7 has higher oxidation resistance, higher hardness, and smaller wear width (higher wear resistance) than the conventional hard films, but is still insufficient.

In contrast, the hard films of Sample Nos. 4 to 6, and 8 to 14 have satisfactorily high oxidation resistance, high hardness and small wear width (high wear resistance).

The hard films of Sample Nos. 4 to 6, and 8 to 14 have higher hardness, higher oxidation resistance, and smaller wear width (higher wear resistance) than the NbTaAl hard films according to the second embodiment of the present invention shown as Inventive Samples in Table 4.

The hard films (including multilayer hard films) according to the present invention are very excellent in hardness and oxidation resistance, can be used as coating films (hard films) typically for tools and dies to improve their durability, and are very useful. Cutting tools and other tools having excellent hardness and oxidation resistance can be obtained by forming the hard films, for example, on iron base materials such as high-speed tool steels (e.g., JIS SKH51, SKD11, and SKD61 steels) and cemented carbides.

While the present invention has been described with reference to what are presently considered to be the preferred embodiments, it is to be understood that the invention is not limited to the disclosed embodiments. On the contrary, the invention is intended to cover various modifications and equivalent arrangements included within the spirit and scope of the appended claims. The scope of the following claims is to be accorded the broadest interpretation so as to encompass all such modifications and equivalent structures and functions.

What is claimed is:

1. A multilayer hard film comprising at least one assemblage of a Layer A or a Layer B with a Layer C arranged alternately,
   wherein the Layer A is a hard film consisting of $[(Nb_{1-d}, Ta_d)_a Al_{1-a}](C_{1-x}N_x)$, wherein "a", "d", and "x" each independently represent an atomic ratio and satisfy the following conditions:
   $0.4<a<0.6$,
   $0<d<1$, and
   $0.4<x<1$,
   wherein, the Layer B is a hard film consisting of $[(Nb_{1-d}, Ta_d)_a Al_{1-a-b-c} Si_b B_c](C_{1-x}N_x)$, wherein "a", "b", "c", "d", and "x" each independently represent an atomic ratio and satisfy the following conditions, provided that one of "b" and "c" may be zero but both of them are not simultaneously zero:
   $0.4<a<0.6$,
   $0<b+c<0.15$,
   $0<d<1$, and
   $0.4<x<1$,
   and
   wherein the Layer C is a hard film consisting of $(Nb_{1-D}, Ta_D)_A Al_{1-A-B-C} Si_B B_C (C_{1-x}N_x)$, wherein "A", "B", "C", "D", and "x" each independently represent an atomic ratio and satisfy the following conditions, provided that one of B and C may be zero but both of them are not simultaneously zero:
   $0.2 \leq A \leq 0.5$,
   $0.15 < B+C \leq 0.5$,
   $0 \leq D \leq 1$, and
   $0.4 \leq x \leq 1$.

2. The multilayer hard film of claim 1, wherein the Layer A or the Layer B has a thickness of 5 nm or more, and the Layer C has a thickness of 1 nm or more.

3. A method for producing the multilayer hard film of claim 1, wherein the method employs
   a deposition system comprising at least one arc evaporation source and at least one sputtering evaporation source; the method comprising
   allowing the arc evaporation source and the sputtering evaporation source to discharge simultaneously; and
   alternately repeating the following:
   placing a work in the front of the arc evaporation source to deposit the Layer A or the Layer B by cathode-discharge arc ion plating; and
   placing the work in the front of the sputtering evaporation source to deposit the Layer C by sputtering.

4. A multilayer hard film prepared by a method comprising alternately repeating the following:
   depositing a film by cathode-discharge arc ion plating in a nitrogen-containing gas or a gaseous mixture containing carbon and nitrogen employing:
   a target consisting of $[(Nb_{1-d}, Ta_d)_a Al_{1-a}]$ wherein "a" and "d" each independently represent an atomic ratio and satisfy the following conditions: $0.4 \leq a \leq 0.6$ and $0 \leq d \leq 1$, or a target consisting of $[(Nb_{1-d}, Ta_d)_a, Al_{1-a-b-c} Si_b B_c]$, wherein "a", "b", "c", and "d" each independently represent an atomic ratio and satisfy the following conditions: $0.4 \leq a \leq 0.6$, $0 < b+c \leq 0.15$, and $0 \leq d \leq 1$, provided that one of "b" and "c" may be zero but both of them are not simultaneously zero; and
   depositing another film by sputtering in a nitrogen-containing gas or a gaseous mixture containing carbon and nitrogen employing a target consisting of $[(Nb_{1-D}, Ta_D)_A, Al_{1-A-B-C} Si_B B_C]$, wherein "A", "B", "C", and "D" each independently represent an atomic ratio and satisfy the following conditions: $0.2 \leq A \leq 0.5$, $0.15 < B+C \leq 0.5$, and $0 \leq D \leq 51$, provided that one of B and C may be zero but both of them are not simultaneously zero.

5. A multilayer hard film comprising at least one assemblage of a Layer S and a Layer T arranged alternately, the Layer S consisting of $[(Ti,Cr,V)_p(Nb,Ta)_q(Al,Si,B)_r](C_{1-x}N_x)$ and satisfying following Conditions (1B) to (8B); and the Layer T consisting of $[(Ti,Cr,V)_p(Nb,Ta)_q(Al,Si,B)_r](C_{1-x}N_x)$ and satisfying following Conditions (1C) to (8C):

| | |
|---|---|
| $p+q+r=1$ | Condition(1B) |
| $p_{Ti}+p_{Cr}+p_V=p$ | Condition(2B) |
| $q_{Nb}+q_{Ta}=q$ | Condition(3B) |
| $r_{Al}+r_{Si}+r_B=r$ | Condition(4B) |
| $0.5 \leq q$ | Condition(5B) |
| $0.5 \leq r \leq 0.73$ | Condition(6B) |
| $0 \leq r_{Si}+r_B \leq 0.15$ | Condition(7B) |
| $0.4 \leq x \leq 1.0$ | Condition(8B) |
| $p+q+r=1$ | Condition(1C) |
| $p_{Ti}+p_{Cr}+p_V=p$ | Condition(2C) |
| $q_{Nb}+q_{Ta}=q$ | Condition(3C) |
| $r_{Al}+r_{Si}+r_B=r$ | Condition(4C) |
| $0.5 \leq q$ | Condition(5C) |
| $0.5 \leq r \leq 0.8$ | Condition(6C) |

$0.15 \leq r_{Si}+r_B \leq 0.5$     Condition(7C)

$0.4 \leq x \leq 1.0$     Condition(8C)

wherein $p_{Ti}$ represents the atomic ratio of Ti; $p_{Cr}$ represents the atomic ratio of Cr; $p_V$ represents the atomic ratio of V; $q_{Nb}$ represents the atomic ratio of Nb; $q_{Ta}$ represents the atomic ratio of Ta; $r_{Al}$ represents the atomic ratio of Al; $r_{Si}$ represents the atomic ratio of Si; $r_B$ represents the atomic ratio of B; and x represents the atomic ratio of N.

6. The multilayer hard film of claim 5, wherein the Layer S has a thickness of 5 nm or more, and the Layer T has a thickness of 1 nm or more.

7. A method for producing the multilayer hard film of claim 5, wherein the method employs a deposition system comprising at least one arc evaporation source and at least one sputtering evaporation source; the method comprising
allowing the arc evaporation source and the sputtering evaporation source to discharge simultaneously; and
alternately repeating the following:
placing a work in the front of the arc evaporation source to deposit the Layer S by cathode-discharge arc ion plating; and
placing the work in the front of the sputtering evaporation source to deposit the Layer T by sputtering.

8. A multilayer hard film prepared by a method comprising alternately repeating the following:
depositing a Layer S by cathode-discharge arc ion plating in a nitrogen-containing gas or a gaseous mixture containing carbon and nitrogen using a target S consisting of $[(Ti,Cr,V)_p(Nb,Ta)_q(Al,Si,B)_r]$ and satisfying following Conditions (1B) to (7B); and depositing a Layer T by sputtering in a nitrogen-containing gas or a gaseous mixture containing carbon and nitrogen using a target T consisting of $[(Ti,Cr,V)_p(Nb,Ta)_q(Al,Si,B)_r]$ and satisfying following Conditions (1C) to (7C):

$p+q+r=1$     Condition(1B)

$p_{Ti}+p_{Cr}+p_V=p$     Condition(2B)

$q_{Nb}+q_{Ta}=q$     Condition(3B)

$r_{Al}+r_{Si}+r_B=r$     Condition(4B)

$0.5 \leq q$     Condition(5B)

$0.5 \leq r \leq 0.73$     Condition(6B)

$0 \leq r_{Si}+r_B \leq 0.15$     Condition(7B)

$p+q+r=1$     Condition(1C)

$p_{Ti}+p_{Cr}+p_V=p$     Condition(2C)

$q_{Nb}+q_{Ta}=q$     Condition(3C)

$r_{Al}+r_{Si}+r_B=r$     Condition(4C)

$0.5 \leq q$     Condition(5C)

$0.5 \leq r \leq 0.8$     Condition(6C)

$0.15 \leq r_{Si}+r_B \leq 0.5$     Condition(7C)

wherein $p_{Ti}$ represents the atomic ratio of Ti; $p_{Cr}$ represents the atomic ratio of Cr; $p_V$ represents the atomic ratio of V; $q_{Nb}$ represents the atomic ratio of Nb; $q_{Ta}$ represents the atomic ratio of Ta; $r_{Al}$ represents the atomic ratio of Al; $r_{Si}$ represents the atomic ratio of Si; and $r_B$ represents the atomic ratio of B.

* * * * *